(12) United States Patent
Ichikawa et al.

(10) Patent No.: US 6,559,821 B2
(45) Date of Patent: *May 6, 2003

(54) MATRIX SUBSTRATE AND LIQUID CRYSTAL DISPLAY AS WELL AS PROJECTOR USING THE SAME

(75) Inventors: Takeshi Ichikawa, Hachioji (JP); Katsumi Kurematsu, Hiratsuka (JP); Osamu Koyama, Hachioji (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/176,271
(22) Filed: Oct. 21, 1998
(65) Prior Publication Data
US 2002/0036606 A1 Mar. 28, 2002

(30) Foreign Application Priority Data

Oct. 24, 1997 (JP) .............................................. 9-292469

(51) Int. Cl.[7] ................................................. G09G 3/36
(52) U.S. Cl. .............................. 345/92; 345/93; 345/97; 345/100; 345/103; 345/98; 257/204; 257/369
(58) Field of Search .............................. 345/92, 93, 97, 345/100, 103, 98; 257/204, 369

(56) References Cited

U.S. PATENT DOCUMENTS

| | | | | |
|---|---|---|---|---|
| 5,200,926 A | * | 4/1993 | Iwahashi et al. | 365/233.5 |
| 5,591,990 A | * | 1/1997 | Misawa et al. | 257/72 |
| 5,691,794 A | * | 11/1997 | Hoshi et al. | 349/158 |
| 5,815,223 A | * | 9/1998 | Watanabe et al. | 349/42 |
| 5,827,755 A | * | 10/1998 | Yonehara et al. | 438/30 |
| 6,127,998 A | * | 10/2000 | Ichikawa et al. | 345/100 |
| 6,157,429 A | * | 12/2000 | Miyawaki et al. | 349/138 |

FOREIGN PATENT DOCUMENTS

JP  9-073103  3/1997

* cited by examiner

Primary Examiner—Richard Hjerpe
Assistant Examiner—Jean Lesperance
(74) Attorney, Agent, or Firm—Fitzpatrick, Cella, Harper & Scinto

(57) ABSTRACT

A liquid crystal display comprising one or more than one shift registers is characterized in that the timing of turning off the input gate of the inverter connected to the gate of the pMOS transistor of the CMOS transistor is earlier than that of the input gate of the inverter connected to the gate of the nMOS transistor of the CMOS transistor by the difference between the two MOS transistors in the time required for getting to a threshold level after turning off the input gate.

35 Claims, 27 Drawing Sheets

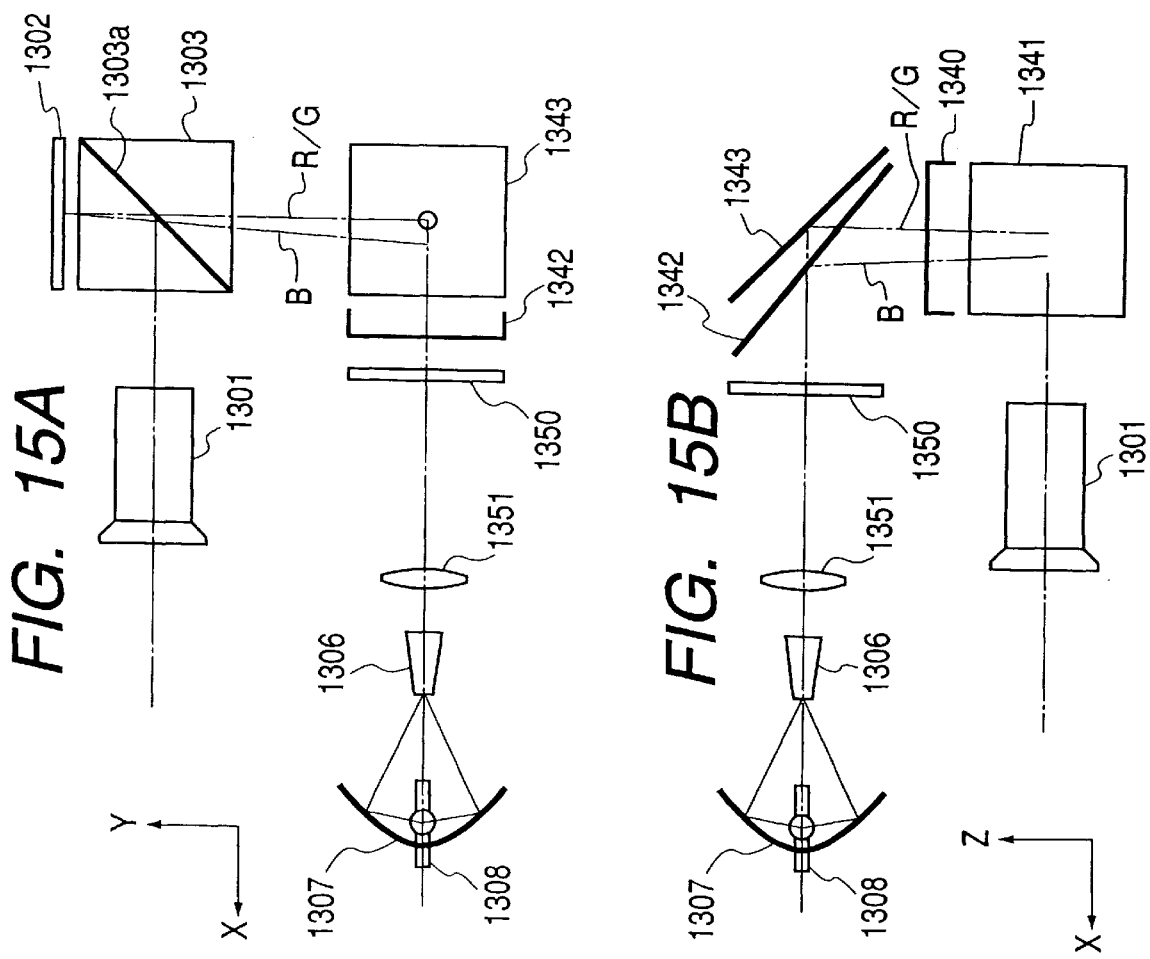

RGB MIXED ARBITRARY COLOR

| R | G | B | R | G | B | R | G | B | R | G | B |
|---|---|---|---|---|---|---|---|---|---|---|---|
| R | G | B | R | G | B | R | G | B | R | G | B |
| R | G | B | R | G | B | R | G | B | R | G | B |
| R | G | B | R | G | B | R | G | B | R | G | B |
| R | G | B | R | G | B | R | G | B | R | G | B |

MATRIX SUBSTRATE AND LIQUID CRYSTAL DISPLAY AS WELL AS PROJECTOR USING THE SAME

BACKGROUND OF THE INVENTION

1. Field of the Invention

This invention relates a matrix substrate and a liquid crystal display apparatus and, more particularly, it relates to a matrix substrate and a liquid crystal display apparatus featured by horizontal and vertical shift registers to be used for scanning liquid crystal devices for display operations as well as to a projector using the same.

2. Related Background Art

In recent years, display apparatus have been playing ever-increasing important roles as means of multi-media communication using images, sounds and written texts. Of them, liquid crystal display apparatus have the advantage of being very thin and consuming little power and the industry of manufacturing liquid crystal display apparatus has grown to a major industry that is comparable with the semiconductor manufacturing industry. It is expected that liquid crystal display apparatus are used in the future not only for personal computers but also for work stations and home television sets having a large display screen. However, a large liquid crystal display apparatus having a large screen is accompanied by high manufacturing cost and electric requirements to be met to drive its large screen. Normally, the manufacturing cost of a liquid crystal display apparatus increases as a function of the square to the cube of the size of the display screen.

In an attempt to bypass this problem, projection systems adapted to optically enlarge the image formed on a relatively small liquid crystal display screen for viewing have been attracting attention. Such a system has become feasible due to the recent technological development that has made it possible to manufacture micro-semiconductor devices on a mass production basis to exploit the scale merit. Then, in the liquid crystal display panel is of the TFT type, TFTs that are small and have a sufficient drive effect have to be used. Additionally, for technological reasons, TFTs using amorphous Si are being replaced by those using polycrystalline Si. On the other hand, video signals for the level of resolution required to meet the NTSC standards or other ordinary television standards do not necessarily have to be processed at high speed.

Thus, it is now possible to produce a liquid crystal display apparatus, wherein not only the TFTs but also the peripheral drive circuits such as shift registers and decoders are made of polycrystalline Si so that the display region and the peripheral drive circuits may be formed integrally. However, polycrystalline Si is not as good as single crystalline Si and, for producing a liquid crystal display apparatus of the XGA (extended Graphic Array) class or the SXGA (Super extended Graphics Array) class, as expressed in terms of the standards for the resolution of computer-generated graphic images, shift registers and other devices may have to be divided and arranged at a plurality of locations. Then, the junctions of adjacent devices can generate noises referred to as ghosts, which provide a problem to be dissolved in this field of technology.

On the other hand, display apparatus comprising a single crystalline Si substrate that shows a much higher drive force that display apparatus having an integral structure of polycrystalline Si has been attracting attention. Since the transistors of the peripheral drive circuits of such display apparatus show a satisfactory drive force and hence do not have to be divided, they are free from the problem of noises.

Regardless of polycrystalline Si or single crystalline Si, it is possible to provide a reflection type liquid crystal display apparatus comprising liquid crystal devices and realized by connecting the drains of TFTs to respective reflection electrodes and arranging pieces of liquid crystal respectively pinched by the reflection electrodes and a corresponding transparent common electrode to form reflection type liquid crystal devices, which liquid crystal devices are then scanned by means of horizontal and vertical shift registers arranged on a same semiconductor substrate.

The applicant of the present patent application has disclosed in Japanese Patent Application Laid-Open No. 9-73103 a reflection type liquid crystal display apparatus realized by using polycrystalline Si and single crystalline Si. A liquid crystal display apparatus as disclosed in the above patent document is proposed to solve some of the problems of known liquid crystal display apparatus of the type under consideration including that light entering the pixel electrodes are scattered in various directions by the undulations on the surface thereof to remarkably reduce the reflection efficiency of light and that such undulations on the surface of the pixel electrodes can give rise to a defective orientation in the process of rubbing the oriented film conducted in the course of mounting the liquid crystal to consequently produce a defective orientation in the liquid crystal that can degrade the quality of the displayed image due to a poor contrast.

According to the above cited Japanese Patent Application Laid-Open No. 9-73103, the surface of the pixel electrodes is polished by means of a technique of chemical mechanical polishing (referred to as CMP hereinafter). Then, all the surfaces of the pixel electrodes are made mirror plane and flush with each other.

Now, an active matrix substrate and a method of manufacturing the same will be summarily described by referring to FIGS. 23A to 23E and 24F to 24H of the accompanying drawings. Note that, while FIGS. 23A to 23E and 24F to 24H show only part of the pixel section of an active matrix substrate, peripheral drive circuits including shift registers for driving the switching transistors of the pixel section may also be formed on the same substrate.

Firstly, an n-type silicon semiconductor substrate 201 showing an impurity concentration level of not greater than $10^{15}$ cm$^{-3}$ is partly and thermally oxidized to produce a LOCOS 202 for each pixel and then boron ions are implanted to a dosage level of $10^{12}$ cm$^{-2}$, using the LOCOS 202 as mask, to produce a PWL 203 which is a p-type impurity region showing an impurity concentration level of about $10^{16}$ cm$^{-3}$ The substrate 201 is then thermally oxidized once again to produce a gate oxide film 204 having a film thickness of not greater than 1,000 angstroms (FIG. 23A).

After forming a gate electrode 205 of n-type polysilicon doped with phosphor to a concentration level of about $10^{20}$ cm$^{-3}$, phosphor ions are implanted into the entire surface of the substrate 201 to a dosage level of about $10^{12}$ cm$^{-2}$ to produce an NLD 206 which is an n-type impurity region showing an impurity concentration level of about $10^{16}$ cm$^{-3}$ and subsequently phosphor ions are implanted to a dosage level of about $10^{15}$ cm$^{-2}$, using a patterned photoresist layer as mask, to produce source/drain regions 207, 207' showing an impurity concentration level of about $10^{19}$ cm$^{-3}$ (FIG. 23B).

Then, a PSG layer 208 is formed on the entire surface of the substrate 201 as interlayer film. The PSG 208 may be replaced by NSG (Non-doped Silicate Glass)/BPSG (Boro-Phospho-Silicate Glass) or TEOS (Tetraethoxy-Silane). Thereafter, a contact hole is formed by patterning in the PSG 208 at a position right above the source/drain regions 207, 207' and then an Al layer is deposited by evaporation, using a sputtering technique, and then patterned to produce an Al electrode 209 (FIG. 23C). Desirably, a barrier metal layer such as a Ti/TiN layer is formed between the Al electrode 209 and the source/drain regions 207, 207'.

Thereafter, a plasma SiN layer 210 and then a PSG layer 211 are formed on the entire surface of the substrate 201 to respective thicknesses of about 3,000 angstroms and 10,000 angstroms (FIG. 23D).

Then, The PSG layer 211 is patterned, using the plasma SiN layer 210 as dry etching stopper layer, until it is left only on the pixel separating regions and subsequently a through hole 212 is formed by patterning, using a dry etching technique, right above the Al electrode 209 that is held in contact with the drain region 207' (FIG. 23E).

Thereafter, a pixel electrode 213 is formed to a film thickness of more than 10,000 angstroms by sputtering or EB (electron beam) evaporation (FIG. 24F). The pixel electrode 213 is typically made of film of a metal selected from Al, Ti, Ta and W or a compound of any of them.

Then, the surface of the pixel electrode 213 is polished by CMP (FIG. 24G).

An oriented film 215 is formed on the active matrix substrate prepared by the above described process and the surface of the oriented film is subjected to an orientation process which is typically a rubbing process before the substrate is bonded to an opposite substrate with spacers (not shown) interposed therebetween and liquid crystal 214 is filled into the gap to produce liquid crystal devices (FIG. 24H). Note that the opposite substrate comprises color filters, a black matrix, a common electrode 223 typically made of ITO and an oriented film 215' arranged on a transparent substrate 220.

The reflection type liquid crystal device is typically driven in a manner as described below. A signal potential is applied to the source region 207 from a peripheral circuit such as shift register formed on the substrate 201 on an on-chip basis and, simultaneously, a gate potential is applied to the gate electrode 205 to turn on the switching transistor of the pixel and feed the drain region 207' with a signal charge. The signal charge is stored in the depletion layer capacitance of the pn-junction formed between the drain region 207' and the PWL 203 and provides the pixel electrode 213 with a potential by way of the Al electrode 209. The potential application to the gate electrode 205 is stopped to turn on the pixel switching transistor when the potential of the pixel electrode 213 gets to a desired level. Since the signal charge is stored in the capacitance of the pn-junction as described above, the potential of the pixel electrode 213 is stabilized until the pixel switching transistor is driven next time. Then, the liquid crystal sealed in the gap between the substrate 201 and the opposite substrate 220 as shown in FIG. 24H is driven by this stabilized potential of the pixel electrode 213.

As for the above described active matrix substrate, since the surface of the pixel electrode 213 is plane and smooth and an insulation layer is buried between any two adjacently located pixel electrodes as shown in FIG. 24H, the surface of the oriented film 215 formed thereon is also smooth and free from undulations. Therefore, the problems of known devices attributable to such surface undulations including a reduced light utilization efficiency due to scattered incident light, a poor contrast due to defective rubbing and the generation of bright lines due to a transversal electric field generated by the steps among the pixel electrodes are eliminated to improve the quality of the displayed image.

However, it has become apparent that a reflection type liquid crystal display apparatus of the above described patent document lacks deliberate considerations on the drive circuit of the active matrix substrate and, according to a study of the inventor of the present invention, has much room for improvement. More specifically, regardless if horizontally or vertically, the timing of operation of the CMOS transfer gate switch that is turned on and off by the output of the shift register is not considered for the display apparatus of the above patent document. If the timing of turning off the pMOS transistor and that of turning off the nMOS transistor in a CMOS transfer gate switch operating as sampling switch, the feedthrough of the one that is turned off late can remain and interfere with the operation of accurately transferring the voltage.

Additionally, for producing a plurality of chips from silicon wafers simultaneously for a liquid crystal apparatus comprising a plurality of liquid crystal devices and peripheral circuits, the space occupied by the peripheral circuits should be minimized.

However, it has become clear with known manufacturing techniques that, in order to make the timing of turning off the pMOS and that of turning off the nMOS transistor agree with each other, measures have to be taken including the provision of a feedback circuit for equalizing the time required for the shift to the H level side to the time required for the shift to the L level side and/or that of a anti-feedthrough circuit. Such measures can significantly raise the circuit dimensions and, additionally, the channel width (W) of the pMOS transistor will have to be designed to be much greater than that of the nMOS transistor according to the moving rate of the transistors to consequently raise the area occupied by the peripheral circuits. As a result of intensive research efforts of the present invention, it has been found that the above identified problems can be dissolved without using a large area for the peripheral circuits by making both the pMOS transistor and the nMOS transistor show an identical turning-off performance for the CMOS transfer gate switch.

SUMMARY OF THE INVENTION

Therefore, it is an object of the present invention to provide a liquid crystal display apparatus that can display high quality images without using a large area for the peripheral circuits by making both the pMOS transistor and the nMOS transistor show an identical turning-off performance for the CMOS transfer gate switch.

Another object of the invention is to provide a liquid crystal display apparatus comprising one or more than one shift registers, characterized in that the output of at least one of the shift registers is connected to the gate of the CMOS transistor by way of an inverter and the timing of operation of the input gate of the inverter connected to the gate of the pMOS transistor of said CMOS transistor is earlier than that of the input gate of the inverter connected to the gate of the nMOS transistor of said CMOS transistor.

According to the invention, the above object is achieved by providing a liquid crystal display apparatus of the type under consideration, wherein the timing of turning off the input gate of the inverter connected to the gate of the pMOS transistor of the CMOS transistor is earlier than that of the input gate of the inverter connected to the gate of the nMOS transistor of the CMOS transistor by the difference between the two MOS transistors in the time required for getting to a threshold level after turning off the input gate.

According to the invention, there is also provided a liquid crystal display apparatus comprising one or more than one shift registers, wherein said shift registers are horizontal shift registers and the outputs are connected to the CMOS transistor for sampling video signals by way of respective inverters.

BRIEF DESCRIPTION OF THE DRAWINGS

FIGS. 15A, 15B and 15C are schematic illustrations of an embodiment of the optical system of a projection type liquid crystal display apparatus according to the invention.

DETAILED DESCRIPTION OF THE PREFERRED EMBODIMENTS

[First Embodiment]

Figure 1:
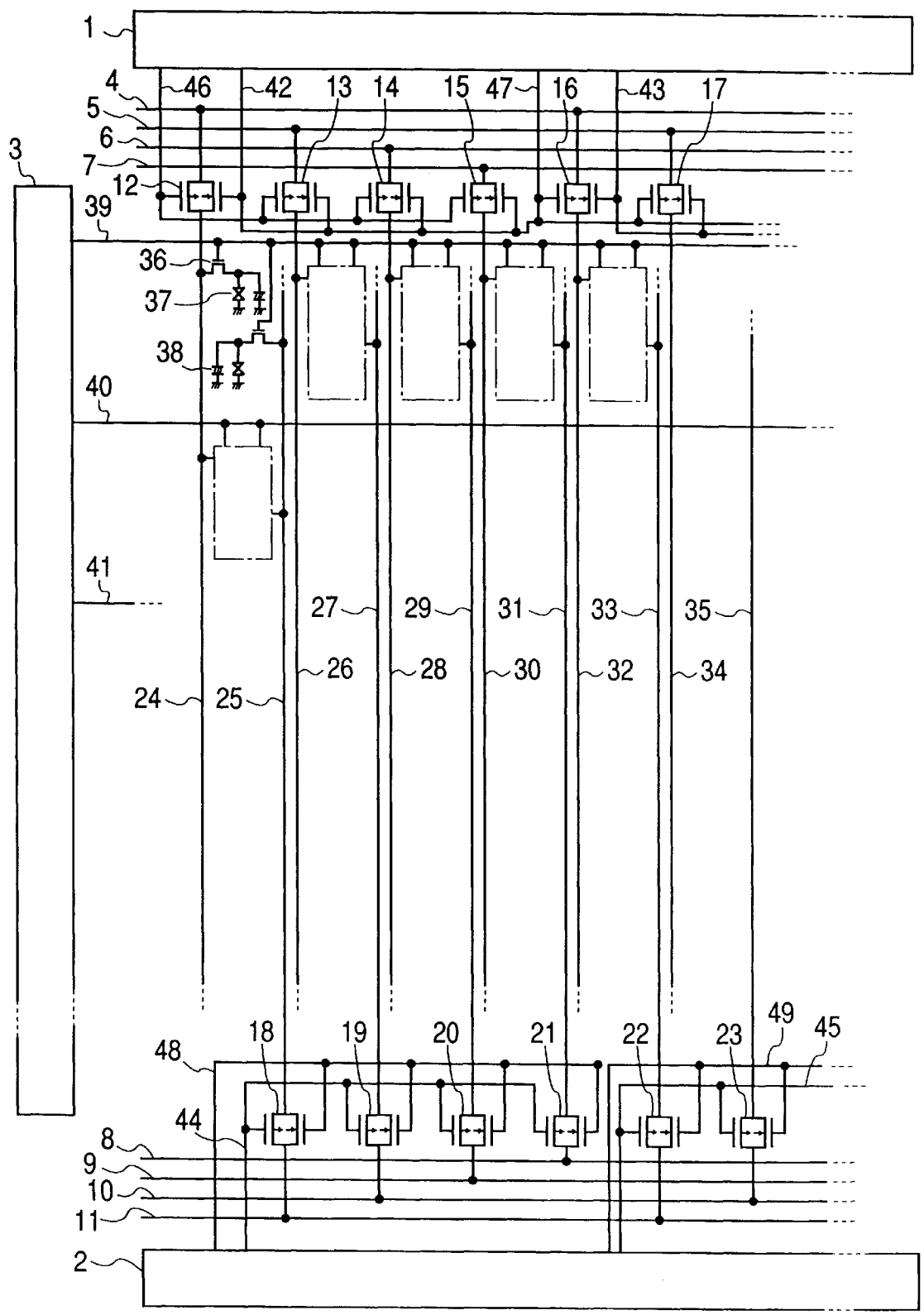
FIG. 1 is a schematic circuit diagram of a first embodiment of the invention.

Now, the invention will be described in greater detail by referring to FIGS. 1 through 4 of the accompanying drawings that illustrate a preferred embodiment of the invention. FIG. 1 is a schematic circuit diagram of the image display section and its related areas of a liquid crystal panel to be used for a liquid crystal projector according to the invention.

Referring to FIG. 1, there are shown horizontal shift registers 1, 2, a vertical shift register 3, video lines 4 through 11, sampling transistors 12 through 23 for sampling video signals from the video lines 4 through 11 according to scanning pulses coming from the horizontal shift registers 1, 2, signal lines 24 through 35, a switching transistor 36 of the pixel section, liquid crystal 37 and an storage capacitance 38. There are also shown drive lines 39, 40, 41 extending from the vertical shift register 3 and output lines 42 through 49 extending from the horizontal shift registers 1, 2.

With the above circuit, the video signals input through the video lines 4 through 11 are sampled by the horizontal shift registers 1, 2 through sampling transistors denoted by 12 through 23. If the drive line 39 of the vertical shift register 3 is in an output state, the switching transistor 36 of the pixel section operates to write the sampled signal line potential on the pixel of the liquid crystal 37 and the storage capacitance 38.

Figure 2:
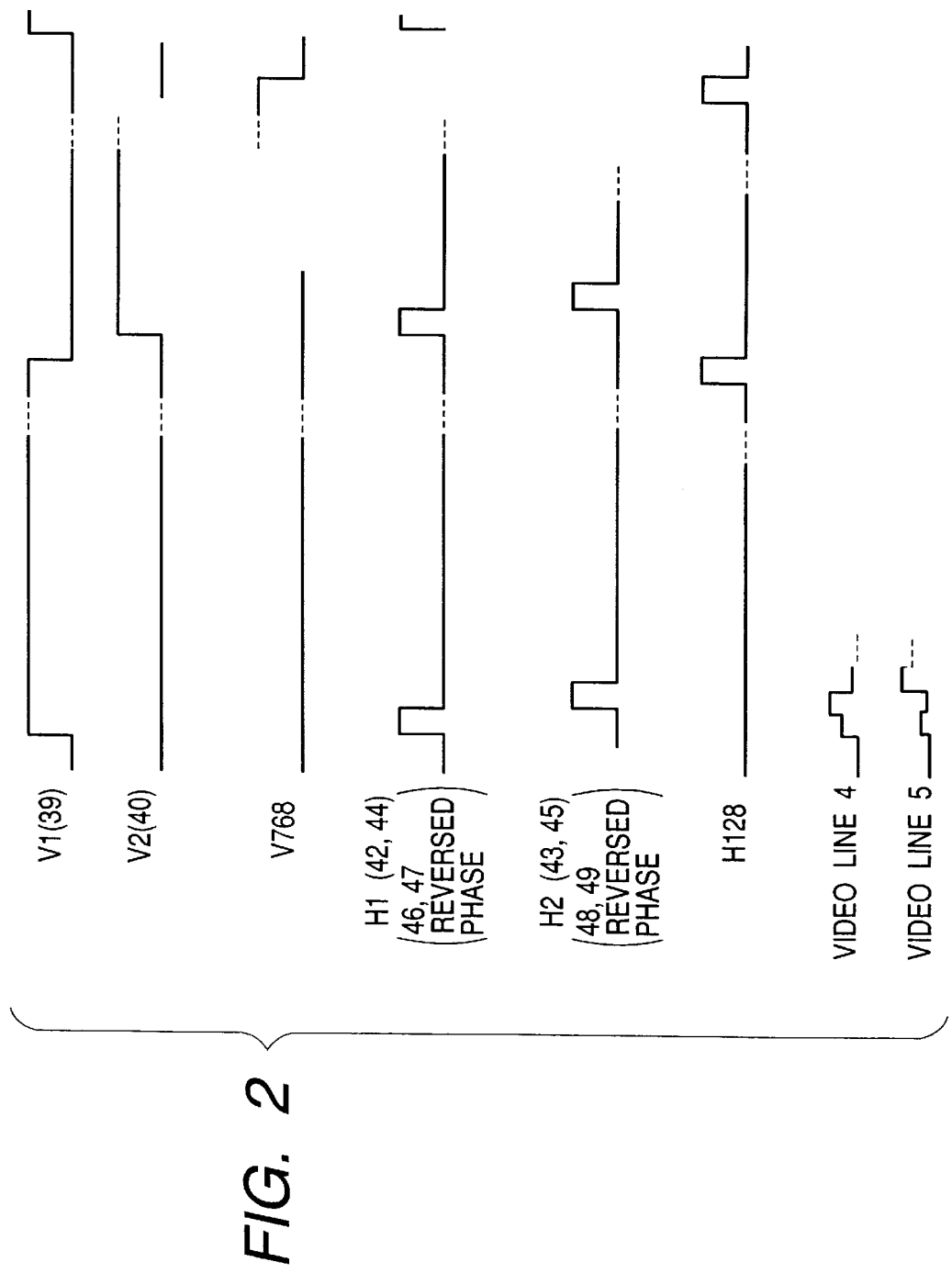
FIG. 2 is a timing chart to be used for the operation of the first embodiment of the invention.

The detailed timings of operation of the circuit will be described by referring to FIG. 2. Assume that the panel is an XGA panel having a total of 1,024×768 pixels.

Firstly, the drive line 39 is brought to level H and turned on and the outputs of the output line 42 through 49 of the horizontal shift registers 1, 2 are sequentially brought to level H while the drive line 39 is on (while operation timings are described in terms of the nMOS transistor, they are also applicable to the pMOS transistor of the CMOS transistor) so that the sampling transistors 12 through 23 are turned on to write the signals of the video lines 4 through 11 into the respective pixels through the signal lines 24 through 35. In this circuit, since the output lines of each of the horizontal shift registers 1, 2 are connected to respective four of the sampling transistors 12 through 23 and the output lines 42 and 44 from the horizontal shift registers 1, 2 are brought to level H simultaneously, the sampling transistors 12 through 19 are brought into a sampling state simultaneously and hence eight potentials are respectively written on eight pixels simultaneously. The horizontal shift registers 1, 2 have 1,024/4=256 rows and, when the operation of writing potentials on the pixels of all the 256 rows is over, the drive line 39 of the vertical shift register 3 is turned off. Then, the drive line 40 from the vertical shift register 3 is brought to level H and the output lines of the horizontal shift registers are sequentially brought to level H to repeat the above described cycle of operation. Now, the cycle of operation that takes place when the outputs of the horizontal shift registers 1, 2 turn off the sampling transistors 12 through 23, or the gates of the pMOS transistors and the gates of the nMOS transistors of the sampling transistors 12 through 23 will be described. As the gates are turned off, the potential of each of the signal lines 24 through 35 change as a function of the ratio of the signal line capacitance and the gate/drain capacitance of the sampling transistor due to the phenomenon of feedthrough.

Figure 3:
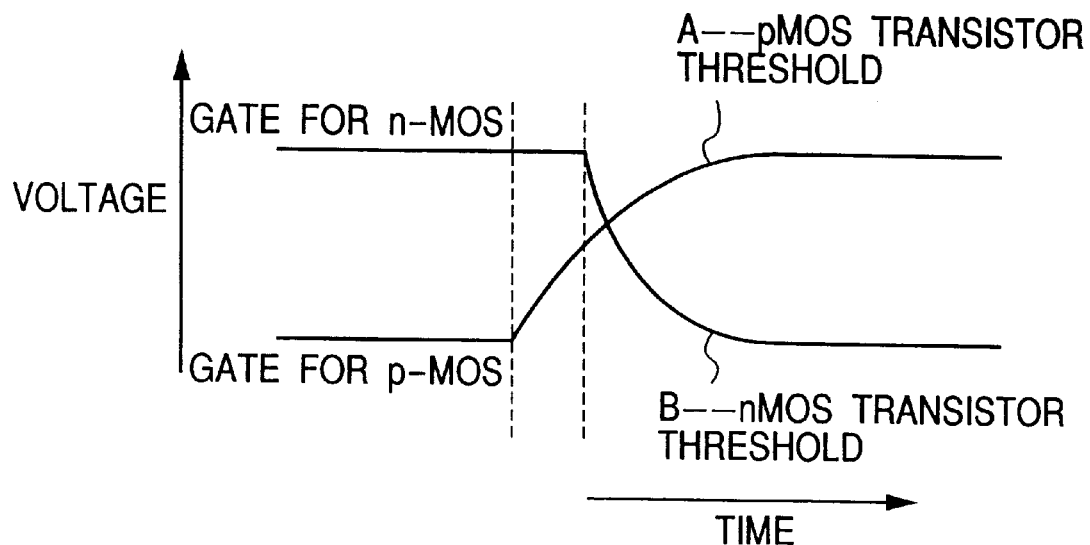
FIG. 3 is a graph showing the performance of the first embodiment.

The feedthrough of the sampling transistors 12 through 23 comprising respective CMOS transistors, each having an nMOS transistor and a pMOS transistor will be described by referring to FIG. 3. FIG. 3 illustrates how the output potentials of the inverters, which are the potential of the gate of the pMOS transistor and that of the gate of the nMOS transistor, change to change what is most important here is that the timing of turning off the pMOS transistor and that of turning off the nMOS transistor of each of the sampling transistors have to be made to agree with each other. If, for example, the nMOS transistor of the sampling transistor is turned off earlier than the pMOS transistor, no feedthrough occurs to the nMOS transistor and the potential of the signal line is held to the desired level because the pMOS transistor remains on. As the pMOS transistor is turned off subsequently, the pixel potential changes positively as a result of feedthrough. The timings of turning off the respective transistors basically come when the gate potentials of the transistors get to the respective threshold levels as indicated by A and B in FIG. 3. If the two timings substantially agree with each other, the feedthrough of the pMOS transistor and that of the nMOS transistor cancel each other to minimize fluctuations in the signal line potential and precisely control the voltage applied to the liquid crystal so that the liquid crystal panel can produce high quality images.

Figure 4:
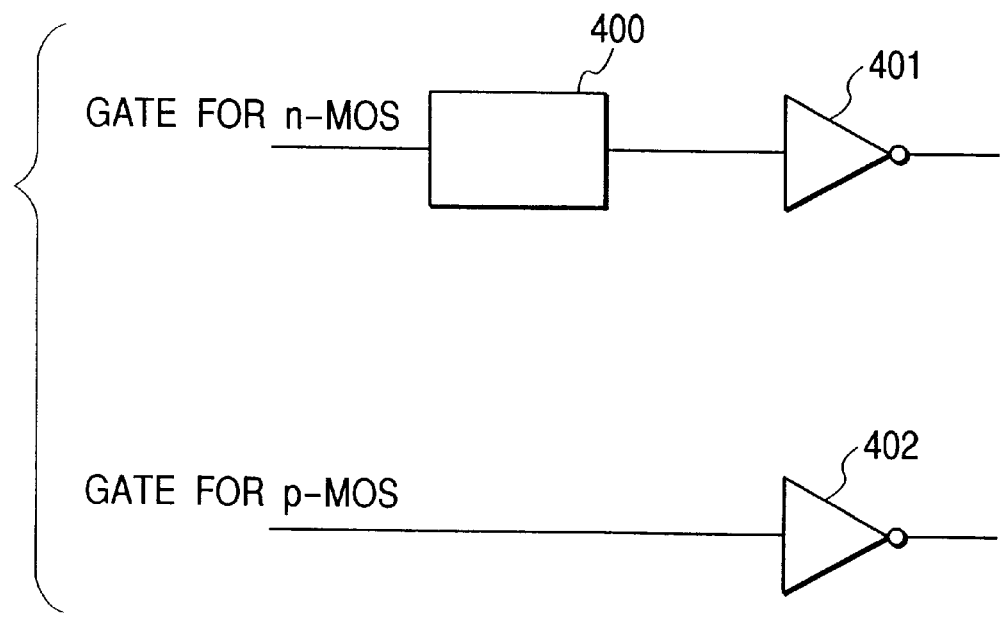
FIG. 4 is a schematic circuit diagram of an equivalent circuit of part of the first embodiment.

In this embodiment, a circuit configuration as described below is used to achieve desired timings for driving the circuit. FIG. 4 is a schematic equivalent circuit diagram of the circuit connected to the output rows of the horizontal shift registers of the first embodiment, where the ratio of the channel width of the nMOS transistor of the inverter to that of the pMOS transistor of the inverter for driving the respective gates of the sampling transistor is 1:2. However, if the gates of the transistors are turned off simultaneously, the output of the inverter of the gate for the nMOS transistor gets to its threshold level earlier than the time when that of the inverter of the gate for the pMOS transistor of the sampling transistor gets to its own threshold level so that the signal line potential fluctuates significantly due to the feedthrough of the pMOS transistor whose gate is turned off subsequently. Therefore, a delay circuit 400 is arranged on the line of the gate of the nMOS transistor so that the inverter of the gate for the pMOS transistor is turned off earlier than the inverter of the gate for the nMOS transistor. With this circuit arrangement of using a small delay circuit 400, the timing of turning off the nMOS transistor and that of turning off the pMOS transistor can be made to agree with each other in the transistor of the related pixel switch to minimize fluctuations in the pixel potential without using a complex circuit for making the timings of operation of-the gates. As a result, fluctuations in the signal potential can also be minimized so that the voltage applied to the liquid crystal can be precisely controlled to produce high quality images. The ratio of the channel width W of the nMOS transistor of the inverter 401 to the channel width W of the pMOS transistor of the inverter 402 for driving the respective gates may be further reduced until the two channel widths become equal to each other in order to further reduce the dimensions of the circuit by so arranging the circuit that the inverter 402 of the gate for the pMOS transistor is turned off more earlier relative to the operation of turning off the inverter 401 of gate for the nMOS transistor. Then, the chip size can be further reduced, while the voltage applied to the liquid crystal can be all the more precisely controlled to produce high quality images.

As discussed above, according to the invention, any discrepancy in the timing of operation of each of the sampling transistors for transferring video signals to the respective liquid crystal pixels from the corresponding video lines can be eliminated by referring to the output timing of the horizontal shift registers in order to provide the liquid crystal pixels with video signals in a consistent manner and produce sharp and clear images on the screen.

[Second Embodiment]

Figure 5:
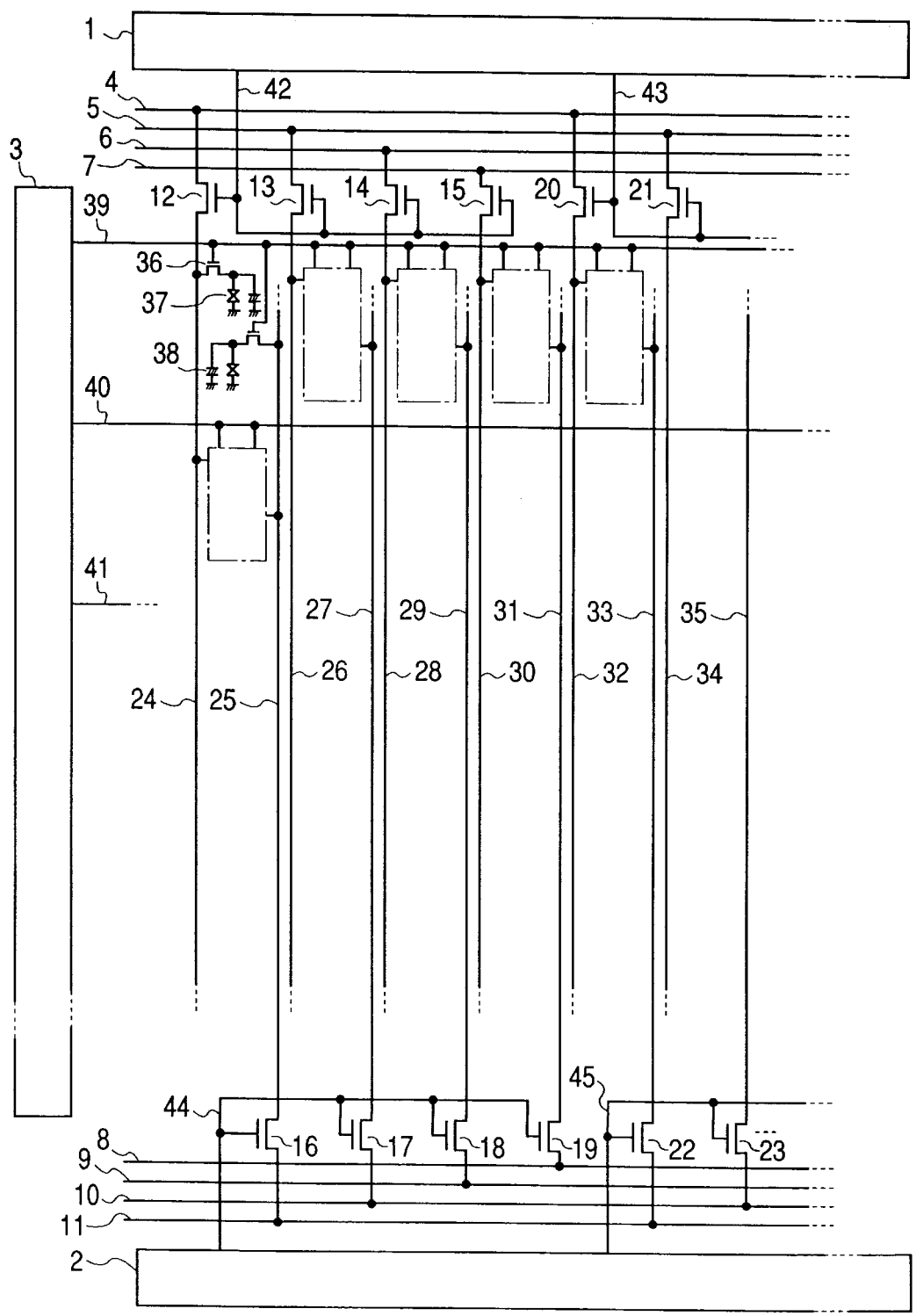
FIG. 5 is a schematic circuit diagram of a second embodiment of the invention.

FIG. 5 is a schematic circuit diagram of the image display section and its related areas of a liquid crystal panel to be used for a liquid crystal projector according to the invention.

Referring to FIG. 5, there are shown horizontal shift registers 1, 2, a vertical shift register 3, video lines 4 through 11, sampling transistors 12 through 23 for sampling video signals from the video lines 4 through 11 according to scanning pulses coming from the horizontal shift registers 1, 2, signal lines 24 through 35, a switching transistor 36 of the pixel section, liquid crystal 37 and an storage capacitance 38. There are also shown drive lines 39, 40, 41 extending from the vertical shift register 3 and output lines 42 through 49 extending from the horizontal shift registers 1, 2.

With the above circuit, the input video signals are sampled by the output pulses of the output lines 42 through 45 extending from the horizontal shift registers 1, 2 through sampling transistors denoted by 12 through 23. If the drive line 39 of the vertical shift register 3 is in an output state, the switching transistor 36 of the pixel section operates to write the sampled signal line potential on the corresponding pixel (while operation timings are described in terms of the nMOS transistor, they are also applicable to the pMOS transistor of the CMOS transistor). The timings of operation of this embodiment are similar to those of the first embodiment. Note that, while the described mode of driving the circuit is same for the above two embodiments, different drive modes may be used for the respective embodiments.

Figure 6:
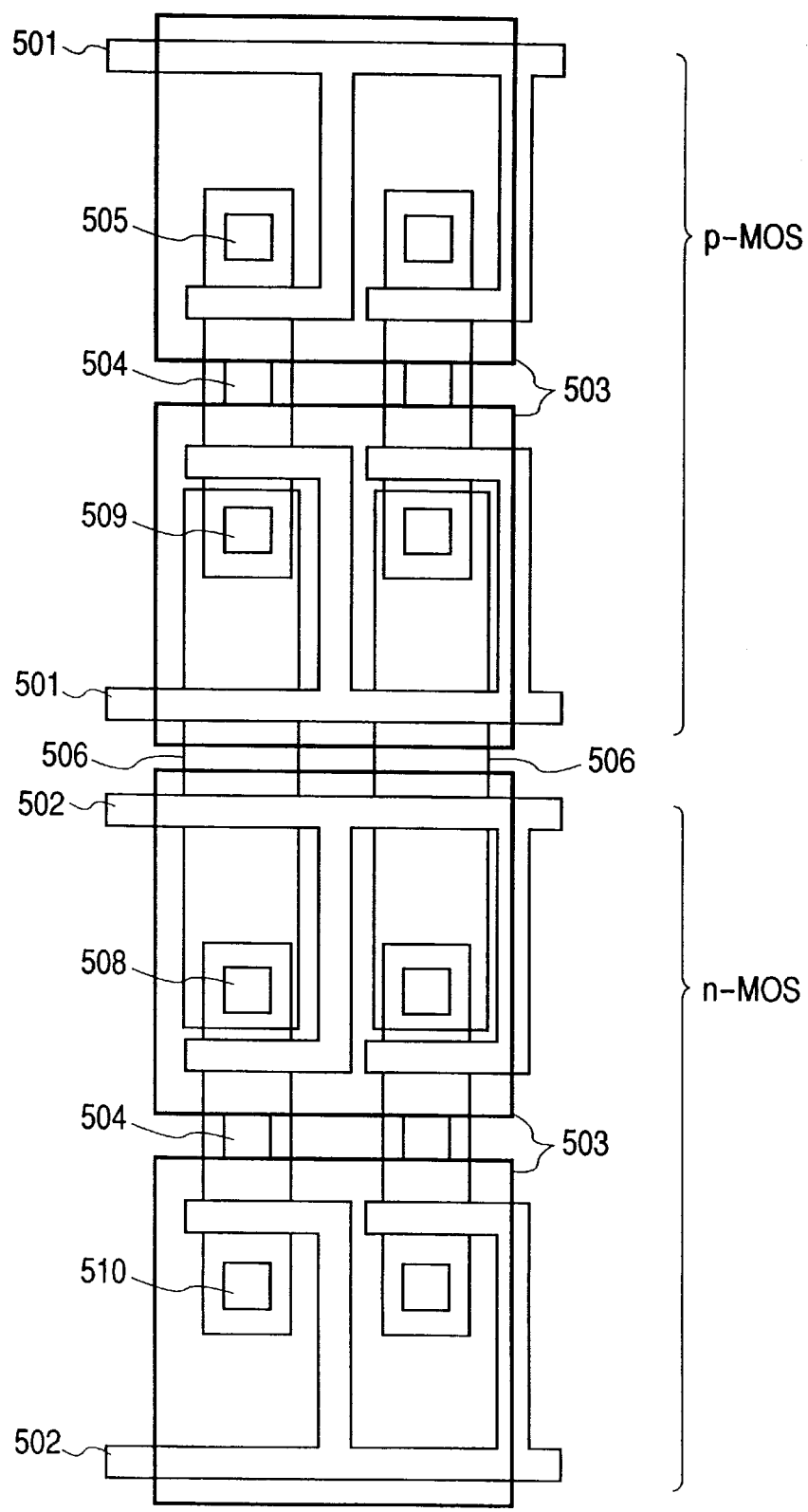
FIG. 6 is a schematic partial plan view of the second embodiment, showing some of its pixels.

FIG. 6 is a schematic partial plan view of the second embodiment, showing some of the switching transistors located near the pixel section of the liquid crystal panel, the liquid crystal and the storage capacitances. In FIG. 6, reference numeral 501 denotes the gate wire of a pMOS transistor and reference numeral 502 denotes the gate wire of an nMOS transistor. Reference numeral 503 denotes a pixel electrode and reference numeral 504 denotes the contact section of the pixel electrode and a related signal line (not shown). Otherwise, reference numerals 505, 508, 509 and 510 denote contact sections of the drain and reference numeral 506 denotes metal wires connecting the pMOS transistor and the nMOS transistor. A pMOSFET is formed by the pMOS source 504 and the pMOS gate 501, the pMOS drain 509, whereas an nMOSFET is formed by the nMOS source, 504, the nMOS gate 502 and the nMOS drain 508.

Referring to FIG. 6, as the potential of the gate wire 501 of the pMOS transistor changes, the pMOS drain 509, the metal wire 506 and the Al electrode (connected to the reflection electrode 508, which is a pixel electrode) including the nMOS drain 508 change their potential due to capacitive coupling but the change in the potential is canceled and suppressed by the change with a reversed phase in the potential of the gate wire 502 of the nMOS transistor.

Also referring to FIG. 6, the gate electrode 501 of the pMOS transistor of a pixel and the gate electrode 502 of the nMOS transistor overlap with the pixel electrode 503 by a same area to make them substantially show a mirror image relative to each other to improve the cancellation effect.

Referring to FIG. 5, when the drive line 39 of the vertical shift register 3 is turned off and hence the gate of the pMOS transistor and that of the nMOS transistor are turned off, then, (1) the pixel potential changes as a function of the ratio of the pixel capacitance to the gate/drain capacitance of the transistors due to feedthrough and, (2) in the case of this embodiment, the pixel potential can also be changed by the capacitive coupling of the gate wire 501 and the metal wire 506 showing the pixel potential.

Thus, to eliminate the problem of (2) above, the gate wire for the pMOS transistor and the gate wire for the nMOS transistor are made to substantially show a mirror image relative to each other and located between the pMOS transistor and the nMOS transistor. With this arrangement, any change in the pixel potential due to the change in the potential of the gate wire 501 for the pMOS transistor is canceled by the change in the pixel potential due to the change of the gate wire 502 for the nMOS transistor to minimize fluctuations of the pixel potential. While the capacitance Cp between the gate wire for the pMOS transistor and the pixel electrode and the capacitance Cn between the gate wire for the nMOS transistor and the pixel electrode should be made equal relative to each other ideally, it is not easy to make any two three-dimensional capacitances such as fringe capacitances equal to each other and hence the gate wires are arranged to substantially show a mirror image as the second best measure.

The phenomenon of (1) above will be described by referring to FIG. 3. FIG. 3 is a graph showing the change in the output potential of each of the selected two inverters of the vertical shift register or the potential of each of the corresponding gate wires. What is most important here is that the timings of turning off the corresponding pixel switches, which are a pMOS transistor and an nMOS transistor, should be made to agree with each other. If the nMOS transistor, or a switch for a pixel CMOS is turned off earlier than the pMOS transistor, or another switch for the pixel CMOS, the pixel potential is held invariable because the pMOS transistor remains on. As the pMOS transistor is turned off subsequently, the pixel potential changes as a result of feedthrough. The timings of turning off the respective transistors basically come when the gate potentials of the transistors get to the respective threshold levels as indicated A and B in FIG. 3. If the two timings substantially agree with each other, it is possible to precisely control the voltage applied to the liquid crystal and hence to produce high quality images. For the purpose of the invention, a circuit configuration as described below is adopted to achieve desired timings for driving the circuit.

FIG. 4 is a schematic equivalent circuit diagram of the circuit connected to the output rows of the horizontal shift registers of the second embodiment, where the ratio of the channel width of the nMOS transistor of the related inverter to the channel width of the pMOS transistor of the related inverter for driving the respective gates of the sampling transistors is 1:2. However, if the gates of the transistors are turned off simultaneously, the output of the inverter of the gate for the nMOS transistor gets to its threshold level earlier than the time when that of the inverter of the gate for the pMOS transistor gets to its own threshold level so that pixel potential fluctuates significantly. Therefore, a delay circuit is arranged on the line of the gate of the nMOS transistor so that the inverter of the gate for the pMOS transistor is turned off earlier than the inverter of the gate for the nMOS transistor. With this circuit arrangement, the timing of turning off the nMOS transistor and that of turning off the pMOS transistor can be made to agree with each other in the transistor of the related pixel switch to minimize fluctuations in the pixel potential. As a result, the voltage applied to the liquid crystal can be precisely controlled to produce high quality images. The ratio of the channel width W of the nMOS transistor to the channel width W of the pMOS transistor of the inverters for driving the respective gates may be further reduced to make the two channel widths until the two channel width become equal to each other in order to further reduce the dimensions of the circuit by so arranging the circuit that the inverter of the gate for the pMOS transistor is turned off more earlier relative to the operation of turning off the inverter of the gate for the nMOS transistor. Then, the chip size can be further reduced, while the voltage applied to the liquid crystal can be all the more precisely controlled to produce high quality images. Note that this circuit arrangement can be combined with the horizontal shift registers of the first embodiment to make the embodiment operate more effectively.

In the above described embodiment, CMOS transistors, each comprising an nMOS transistor and a pMOS transistor, are used for switching operations for feeding video signals to the liquid crystal. In particular, the wires of each gate and the means for driving each gate are described in detail. However, other techniques may be used to drive the gates in an coordinated manner when CMOS transistors are used for switching operations.

[Third Embodiment]

Figure 7:
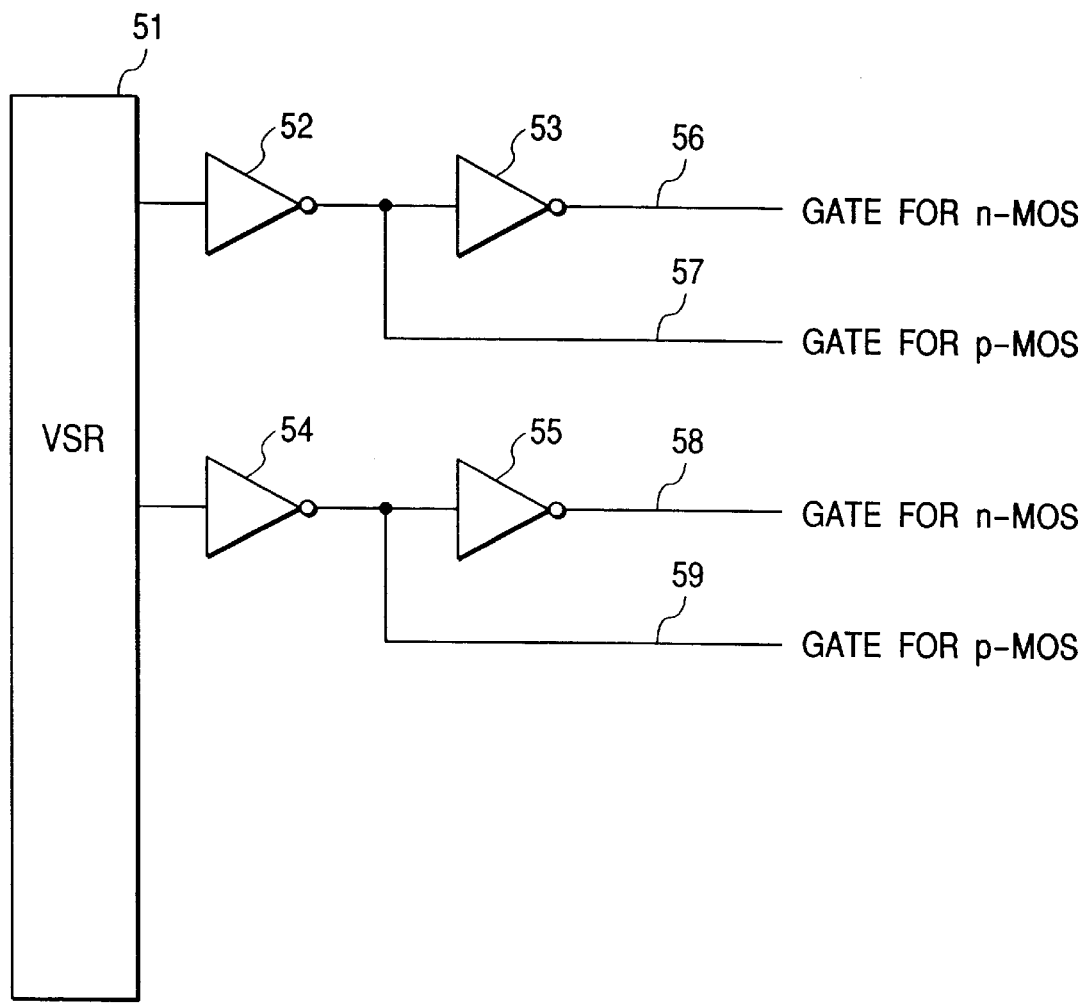
FIG. 7 is a schematic circuit diagram of part of a third embodiment.

A third embodiment of the invention will be now described in detail by referring to FIG. 7. FIG. 7 is a schematic equivalent circuit diagram of the circuit connected to the output rows of the vertical shift register of the second embodiment, where shift pulses from the vertical shift register 51 are fed to the gate for the pMOS transistor by way of inverters 52, 54 and then further to the gate for the nMOS transistor by way of inverters. The ratio of the channel width of the nMOS transistor of the related inverters to the channel width of the pMOS transistor of the related inverters for driving the respective gates of the sampling transistors is 1:2. However, if the gates of the transistors are turned off simultaneously, the output of the inverters of the gate for the nMOS transistor gets to its threshold level earlier than the time when that of the inverter of the gate for the pMOS transistor gets to its own threshold level so that pixel potential fluctuates significantly. In this embodiment, this problem is dissolved by using a smaller number of circuits for driving the gate of the pMOS transistor than the number of circuits for driving the gate of the nMOS transistor so that the gate of the inverters for the pMOS transistor may be turned off earlier than the gate of the inverters for the nMOS transistor. With this circuit arrangement, the timing of turning off the nMOS transistor and that of turning off the pMOS transistor can be made to agree with each other in the transistor of the related pixel switch to minimize fluctuations in the pixel potential. Then, the chip size can be further reduced, while the voltage applied to the liquid crystal can be all the more precisely controlled to produce high quality images. While the embodiment is described above in terms of the vertical shift register, it may be needless to say that the circuit arrangement is also applicable to the horizontal shift registers as described above for the first embodiment.

[Fourth Embodiment]

Now, a liquid crystal display apparatus that can be realized by applying the circuit arrangement of any of the first through third embodiments will be described.

While a plurality of liquid crystal panels are described for this embodiment, the present invention is not limited thereto and they may be combined in various ways to enhance the overall effect of the invention. While the liquid crystals panels as described below comprise a semiconductor substrate, the present invention is by no means limited to the use of a semiconductor substrate and it may be replaced by an ordinary transparent substrate. Similarly, while a reflection type liquid crystal display apparatus is described for this embodiment, it may be replaced by a transmission type liquid crystal display apparatus. Additionally, while the liquid crystal panels as described below are either of the MOSFET type or of the TFT type, they may alternatively be of a two terminal type such as the diode type. The liquid crystal panels as described below can effectively be used for various display apparatus including home television sets, projectors, head mount displays, 3-D video game apparatus, lap top computers, electronic notebooks, teleconferencing systems, car navigation systems and cockpit panels of aircraft.

Figure 8:
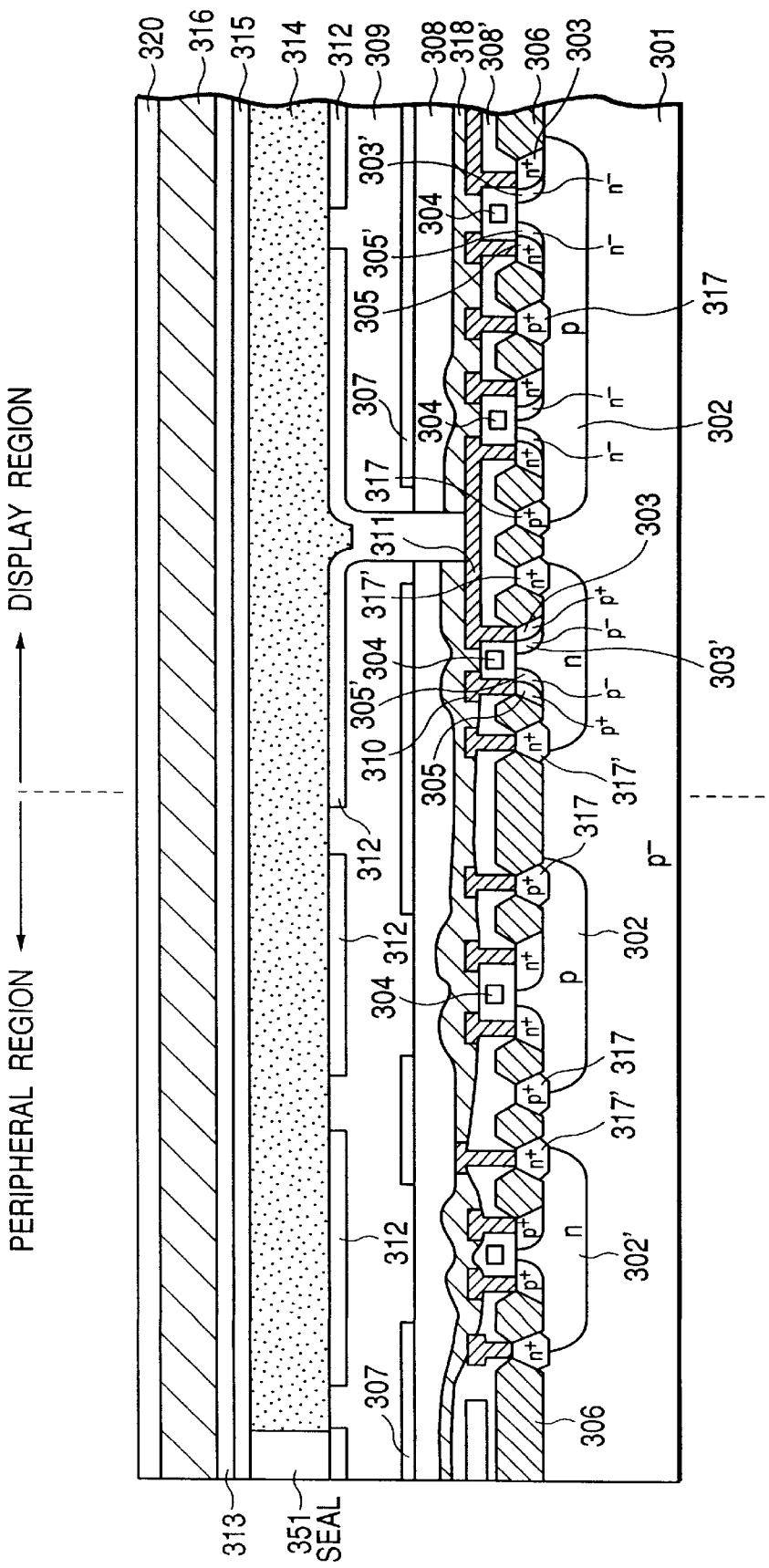
FIG. 8 is a schematic cross sectional view of a liquid crystal device prepared by using a CMP technique for the purpose of the invention.

FIG. 8 is a schematic cross sectional view of a liquid crystal panel according to the invention. In FIG. 8, there are shown a semiconductor substrate 301, p-type and n-type wells 302, 302', transistor source regions 303, 303', 303", a transistor gate region 304 and transistor drain regions 305, 305', 305".

Referring to FIG. 8, since a high voltage of 20 to 35V is applied to the transistors in the display region, the source/drain layer is not formed in a self-aligning manner but arranged with a certain degree of offset relative to the gate 304 so that a low concentration n⁻ layer and a low concentration p⁻ layer are formed respectively in the p-well and the n-well located therebetween as shown in the source region 303' and the drain region 305'. The offset is preferably between 0.5 and 2.0 μm. On the other hand, in the part of the peripheral circuits shown in the left half of FIG. 8, a source/drain layer is formed in a self-aligning manner relative to the gate 304.

While the offset of the source/drain layer is described above, the offset may be modified as a function of their withstand voltages and the gate length may be optimized to maximize the offset effect. Note that the peripheral circuits are partly logic type circuits that are driven typically by 1.5 to 5V so that the source/drain layer can be formed in self-aligning manner to reduce the dimensions of the transistors and improve the efficiency of driving the transistors.

The substrate 301 is made of a p-type semiconductor and shows the lowest potential of the apparatus (normally the ground potential) and a voltage for driving pixels, which is typically between 20 and 35V, is applied to the n-type wells in the display region, whereas a voltage for driving logics, which is typically between 1.5 and 5V is applied to the logic sections of the peripheral circuits. With such an arrangement, the devices of the apparatus may be configured optimally depending on the voltage applied thereto to consequently reduce the chip size and improve the speed of driving the pixels for displaying images.

Referring to FIG. 8, there are also shown a field oxide film 306, source electrodes 310 to be connected to respective data wires, drain electrodes 311 to be connected to respective pixel electrodes, pixel electrodes 312 operating as so many reflectors, a shield layer 307 for covering areas not occupied by the pixel electrodes 312 typically made of Ti, TiN, W or Mo. As shown in FIG. 8, while the shield layer 307 covers areas connecting the pixel electrodes 312 and the drain electrodes 311 in the display region, it is removed in areas of the peripheral region including part of the video lines and the clock lines where the wire capacitance shows a large value whereas it covers the layer of the pixel electrodes 312 in areas where rapid signals can be mixed with illumination light to erroneously operate the circuit. In FIG. 8, reference numeral 308 denotes an insulation layer of P—SiO arranged under the shield layer 307 and on another P—SiO layer 318 and processed by smoothing operation using an SOG. It may be needless to say that the smoothing process using an SOG can be replaced by a process of forming a P-TEOS (Phospho-Tetraetoxy-Silane) film and covering it with a P—SiO layer, which is followed by a CMP process for smoothing the insulation layer 308.

Reference numeral 309 denotes another insulation layer arranged between the reflection electrodes 312 and the shield layer 307 so that the charge retaining capacitance of the reflection electrodes 312 can be provided by way of this insulation layer 309. A laminate film comprising P—SiN and/or $Ta_2O_5$ layers having a high dielectric constant in addition to an $SiO_2$ layer may effectively be used for generating a large capacitance. The shield layer 307 of Ti, TiN, Mo or W formed on a smooth surface preferably has a film thickness between 500 and 5,000 angstroms.

Otherwise, there are also shown a liquid crystal layer 314, a common transparent electrode 315, an opposite substrate 316, high concentration impurity regions 317, 317' and an anti-reflection film 320.

As shown in FIG. 8, the high concentration impurity regions 317, 317' having a polarity same as that of the wells 302, 302' and formed under the transistors are located in and on the peripheries of the wells 302, 302' and operate as a sort of guard rings so that, if a high frequency signal is applied to the sources of the transistors, they operate stably to produce high quality images because the potential of the wells are stably held to a desired low level by the low resistance layer. Additionally, said high concentration impurity regions 317, 317' are arranged between the n-type well 302' and the p-type well 302 with the field oxide film interposed therebetween to eliminate the use of a channel stop layer that is typically used for ordinary MOS transistors and arranged right under the field oxide film.

Since the high concentration impurity regions 317, 317' can be formed during the process of producing the source/drain layer, the overall number of masks and that of processing steps required for manufacturing the apparatus can be reduced to consequently reduce the manufacturing cost.

Reference numeral 313 denotes an AR coat layer arranged between the common transparent electrode 315 and the opposite substrate 316 as anti-reflection film layer and designed to reduce the interface reflectivity by taking the refractive index of the liquid crystal into consideration. Then, the insulation film layer preferably shows a refractive index smaller than that of the opposite substrate 316 and that of the transparent electrode 315.

Figure 9:
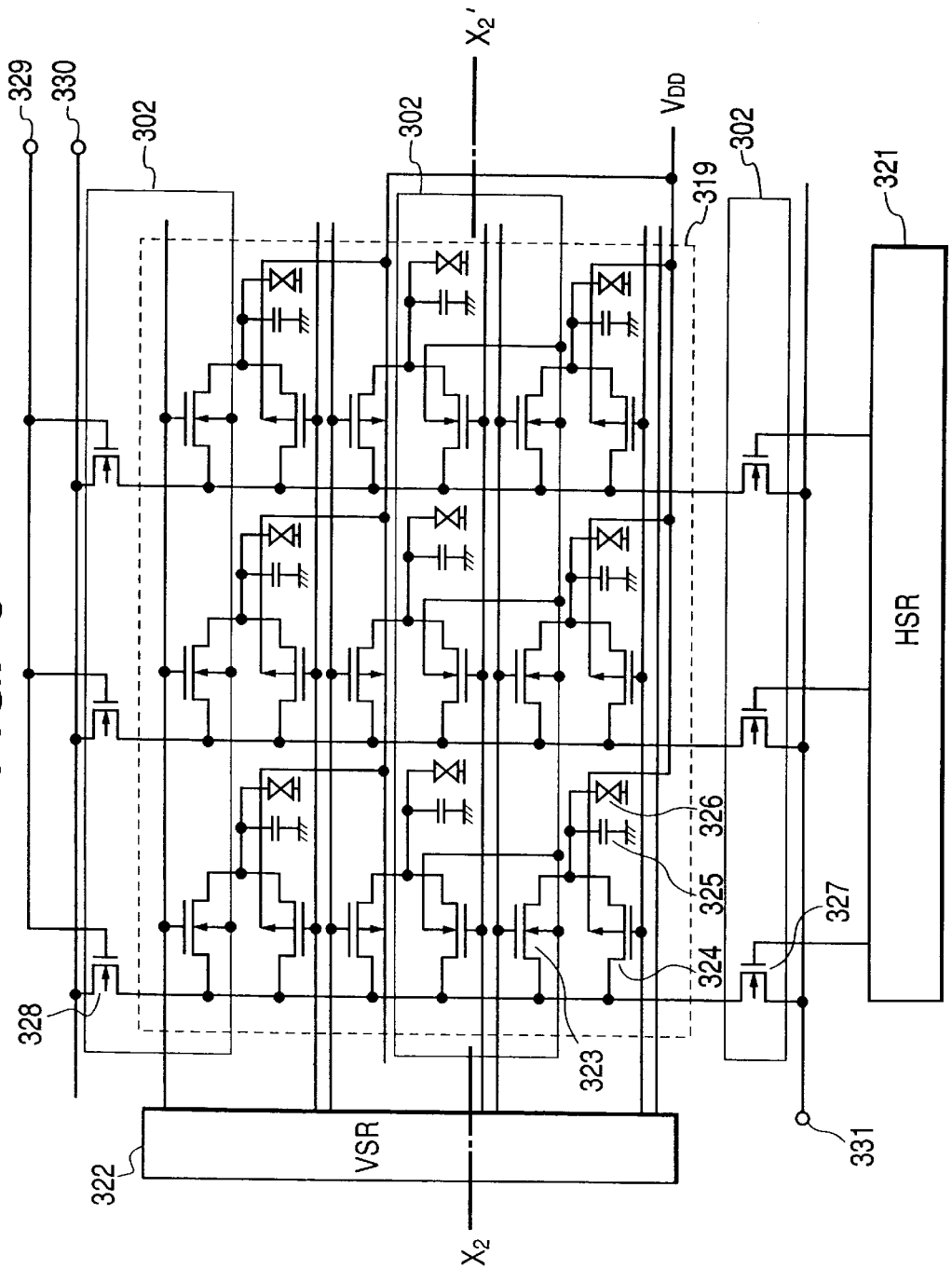
FIG. 9 is a schematic circuit diagram of a liquid crystal apparatus according to the invention.

FIG. 9 is a schematic plan view of the embodiment. In FIG. 9, there are shown a horizontal shift register 321, a vertical shift register 322, p-channel MOSFET, hold capacitances 325, a liquid crystal layer 326, signal transfers switches 327, reset switches 328, a reset pulse input terminal 329, a reset power supply terminal 330 and a video signal input terminal 331. While the illustrated semiconductor substrate 301 of the p-type, it may alternatively be of the n-type.

The well region 302' is of the conductivity type opposite to that of the semiconductor substrate 301. Thus, the well region 302 of FIG. 8 is of the p-type. The p-type well region 302 and the n-type well region 302' are preferably implanted with an impurity to a concentration level higher than that of the semiconductor substrate 301. If the impurity concentration level of the semiconductor substrate 301 is $10^{14}$ to $10^{15}$ (cm$^{-3}$), that of the well region 302 is preferably $10^{15}$ to $10^{17}$ (cm$^{-3}$).

The source electrode 310 is connected to the corresponding data wire for transmitting display signals, while the drain electrode 311 is connected to the corresponding pixel electrode 312. The electrodes 310, 311 are typically made of wires of a material selected from Al, AlSi, AlSiCu, AlGeCu and AlCu. The electrodes 310, 311 provide a stable electric contact with semiconductor with a reduced contact resistance when a bimetal layer of Ti and TiN is arranged on the lower surfaces thereof that contact with semiconductor. The pixel electrodes 312 preferably has a plane and smooth surface and shows a high reflectivity. Materials that can be used for the pixel electrode 312 include Cr, Au and Ag as well as metals that are ordinarily used for wires such as Al, AlSi, AlSiCu, AlGeCu and AiC. The surfaces of the underlying insulation layer 309 and the pixel electrodes 312 are processed by chemical mechanical polishing (CMP).

Each of the hold capacitances 325 is used to hold signals between the related pixel electrode 312 and the common transparent electrode 315. The substrate potential is applied to the well regions 302. In the transmission gates of this embodiment, n-channel MOSFETs 323 and p-channel MOSFETs 324 are arranged respectively high and low in the first row whereas p-channel MOSFETs 324 and n-channel MOSFETs 323 are arranged respectively high and low in the second row and so on in an alternating fashion. As described above, the pixel electrodes 312 are held in contact not only with the power supply lines at the stripe-type wells in the peripheral zone of the display region but also with fine power source lines arranged in the display region.

With such a circuit configuration, the key of stabilization lies in the resistance of the wells. Therefore, it is so arranged that, if a p-type substrate is used, n-type wells have a contact area or a number of contacts greater than the contact area or the number of contacts, whichever appropriate, of the p-type wells. Then, the p-type wells are secured for a predetermined potential by the p-type substrate, which operates as a low resistance member. While they may be affected to show a swinging potential by the input and output signals of the source/drains of the n-type wells, such a phenomenon can be prevented by increasing the contact area of the upper wiring layers to stably display high quality images.

Video signals (including proper video signals, pulse-modulated digital signals, etc.) are input through the video signal input terminal 331 and the signal transfer switches 327 are closed or opened according to the pulses from the horizontal shift registers 321 to output the signals to the data wires. A high pulse is applied from the vertical shift register 322 to the gates of the n-channel MOSFETs 323 of the selected row, whereas a low pulse is applied from the vertical shift register 322 to the gates of the p-channel MOSFETs of that row.

As described above, the switches of the pixel section are constituted by single crystalline CMOS transmission gates, each comprising an nMOS 323 and a pMOS 324 so that signals to be written on the pixel electrodes are not restricted by the threshold value of the MOSFETs and the signals of the sources can be written without restrictions.

Additionally, since the switches of the pixel section are constituted by single crystalline transistors, they do not show any instability in the operation that can occur along the crystal grain boundaries of polysilicon-TFTs and hence can show a highly reliable and quick drive effect.

Figure 10:
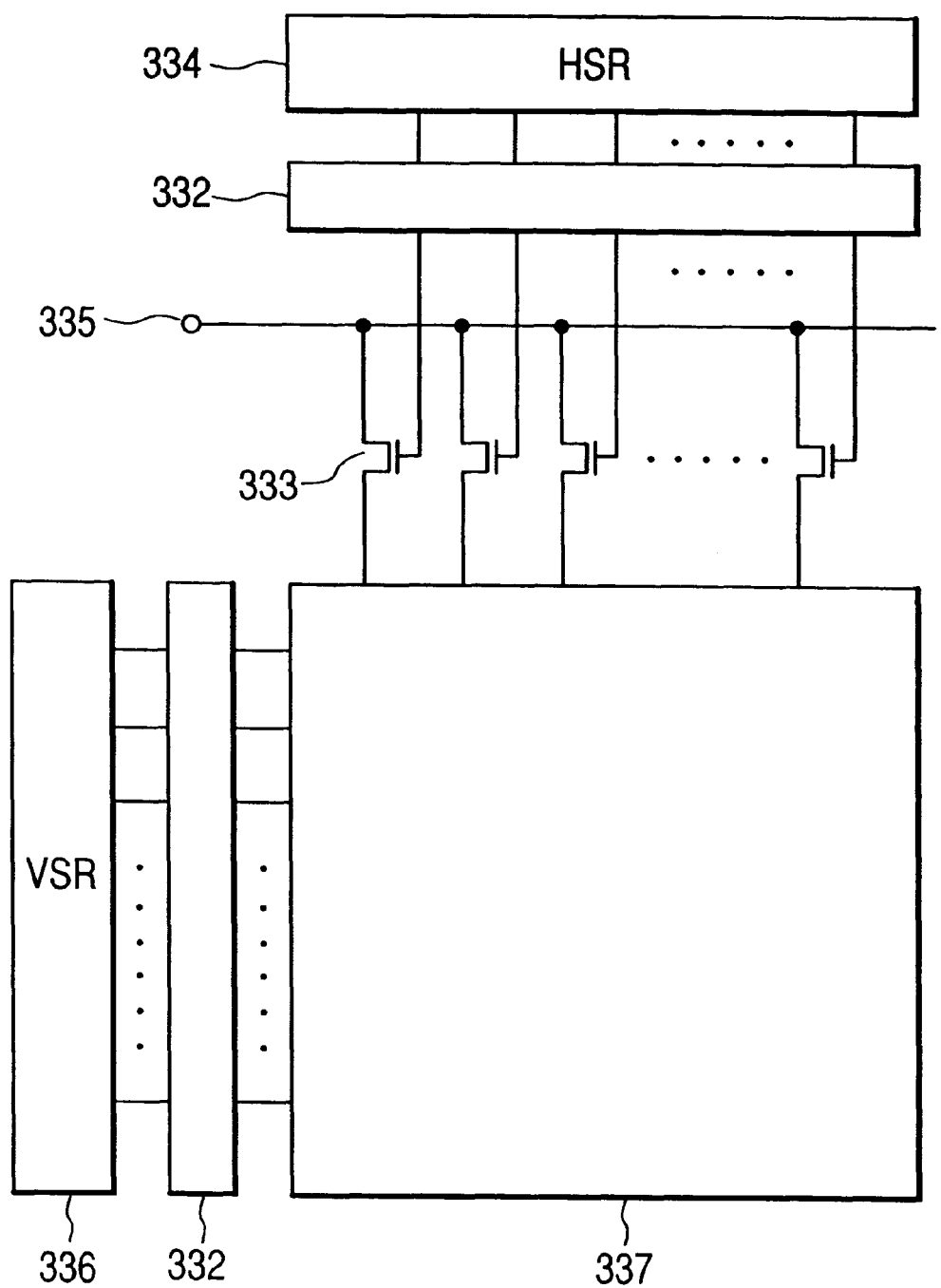
FIG. 10 is a schematic block diagram of a liquid crystal apparatus according to the invention.

Now, the circuit configuration of the peripheral circuits of the panels will be described by referring to FIG. 10. In FIG. 10, there are shown a display region 337 of liquid crystal devices, a level shifter circuit 332, video signal sampling switches 333, a horizontal shift register (HSR) 334, a video signal input terminal 335 and a vertical shift register (VSR) 336.

The horizontal and vertical shift registers (SRs) 334, 336 can be driven bi-directionally by selection switches for scanning operations so that they can adapt themselves to positional rearrangements of the optical system and other modifications without modifying the panel. Thus, same and identical panels can be used for different product lines to reduce the manufacturing cost. While the video signal sampling switches of FIG. 10 are of a one-transistor type with one-side polarity, input video signals can accurately be written on the signal lines by using this embodiment comprising switches constituted by CMOS transmission gates in a manner as described above.

Figure 11:
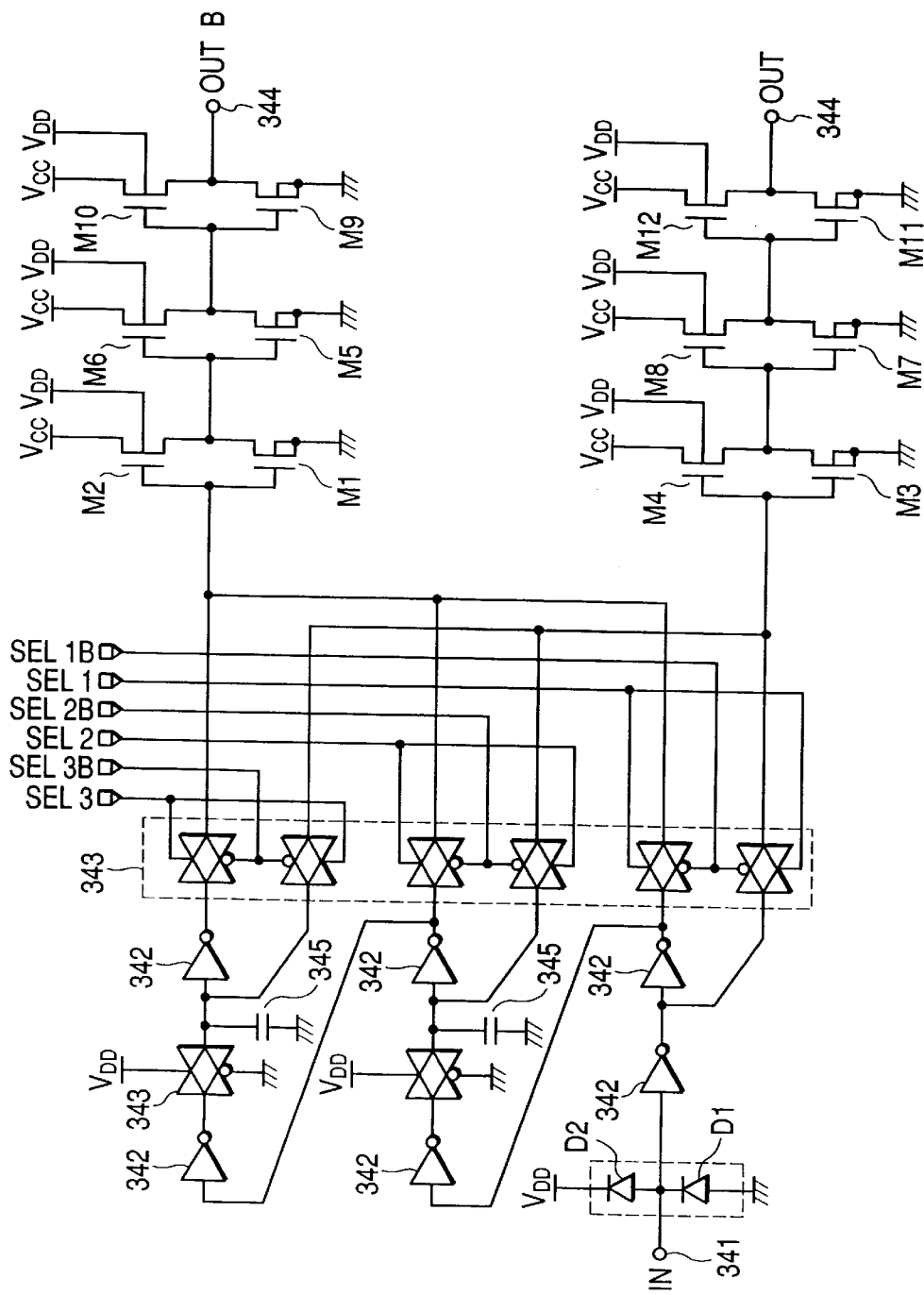
FIG. 11 is a schematic circuit diagram of part of a liquid crystal apparatus according to the invention, including a delay circuit for the input section of the apparatus.

Now, a method of accurately synchronizing a video signal and a sampling pulse will be described by referring to FIG. 11. For synchronization, the amount of delay of the sampling pulse should be modified. In FIG. 11, reference numeral 342 denotes pulse delaying inverters and reference numeral 343 denotes switches for selecting a delaying inverter, whereas reference numeral 344 denotes outputs having a controlled amount of delay (outB is for outputs with the reversed phase and outA is for outputs with the original phase) and reference numeral 345 denotes capacitances. Reference numeral 346 denotes a protection circuit.

The number of delaying inverters 342 to be passed through can be determined by combining SEL1 (SEL1B) through SEL3 (SEL3B) appropriately. Referring to FIG. 11, for example, if only SEL3 is brought to level H, a delay time equal to five times of the shortest delay time of a single inverter can be obtained.

When the panels of R, G and B comprise this synchronizing circuit and the amounts of delay of externally applied pulses have lost the symmetry for some reasons, for example, attributable to the jigs involved, they can be regulated by means of the selection switches SEL to produce high quality images without color separation caused by phase shifts of R, G and B pulses. It may be effective to arrange temperature sensing diodes in the inside of the panels for temperature corrections to be realized by means of their outputs, referring to a table of amounts of delay.

Now, the liquid crystal material will be discussed. The panel of FIG. 8 has a pair of flat and oppositely disposed substrates and the common electrode substrate 316 has undulations on the surface in order to prevent reflections at the interface with the common transparent electrode 315 that is carried on the surface. An anti-reflection film 320 is arranged on the other surface of the common electrode substrate 316. The substrate may be ground with fine grinding grains to produce undulations that can improve the contract of the displayed image.

Polymer network liquid crystal PNLC is used for the liquid crystal of the panels. The polymer network liquid crystal may be PDLC (Polymer Dispersed Liquid Crystal) for the purpose of the invention. Polymer network liquid crystal PNLC is prepared typically by a polymerization phase separation technique. With this technique, a solution of liquid crystal and polymerizing monomer or oligomer is prepared and poured into a cell, where the liquid crystal and the polymer are phase-separated by UV polymerization to produce a network of polymer in the liquid crystal. PNLC contains liquid crystal to a large extent (70 to 90 wt %). If nematic liquid crystal that is refractively highly anisotropic ($\Delta n$) is used, the PNLC will intensely scatter light. If, on the other hand, nematic liquid crystal that is dielectrically highly anisotropic ($\Delta \epsilon$) is used, the PNLC will be driven with low voltage. The light scattering effect of a polymer network will be sufficiently high for achieving a good contrast when the centers of the meshes of the network are separated by a distance between 1 and 1.5 $\mu$m.

Figure 12:
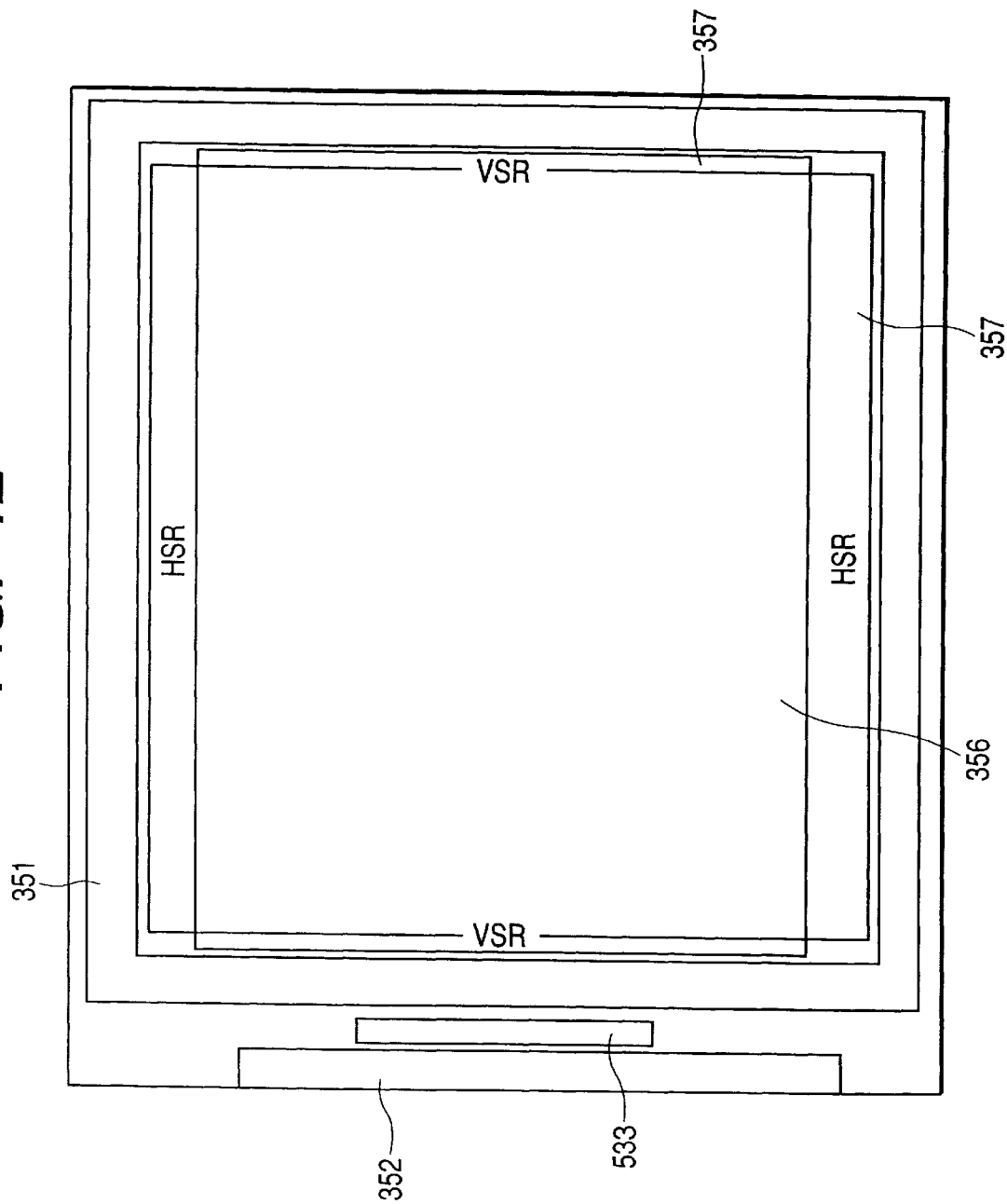
FIG. 12 is a schematic plan view of the liquid crystal panel of a liquid crystal apparatus according to the invention.

Now, the relationship of the sealing arrangement and the structure of the panels will be described by referring to FIG. 12. In FIG. 12, there are shown a seal section 351, an electrode pad 352 and a clock buffer circuit 353. An amplifier section (not shown) is provided and used as output amplifier for electrically testing the panels. There is also provided an Ag paste section (not shown) for providing the opposite substrate with a given potential. Reference numeral 356 denotes the display section of the panels comprising liquid crystal devices and reference numeral 357 denotes the peripheral circuit section including horizontal and vertical shift registers (SR) to be used for the display section 356. The seal section 351 surrounds the display section 356 and is used to bond the semiconductor substrate 301 carrying thereon pixel electrodes 312 and the glass substrate carrying thereon a common electrode 315 by means of a pressure bonding material or an adhesive agent. After bonding the two electrodes along the seal section 351, liquid crystal is poured into the display section 356 and the shift register section 357 and sealedly held there.

As shown in FIG. 12, circuits are arranged outside the seal section of this embodiment in order to reduce the total chip size. While only a single pad 352 is arranged along an edge of the panels, wires may be drawn out from the inside of the panels by way of a plurality of pads arranged along more than one edges of the panels. Such a multi-edge arrangement will be advantageous for handling high speed clocks.

The substrate potential of the panels of this embodiment comprising semiconductor substrates such as Si substrates can fluctuate to cause the panels to operate erroneously when the lateral walls of the panels are irradiated with light intensely. Therefore, a substrate holder having a shield effect is arranged to cover the lateral walls of the panels and the peripheral circuit section surrounding the display region on the front side of the panels, whereas the rear surfaces of the Si substrates are covered by a holder, to which metal components including those made of Cu and showing a high thermal conductivity are connected by way of adhesive also showing a high thermal conductivity.

Figure 13:
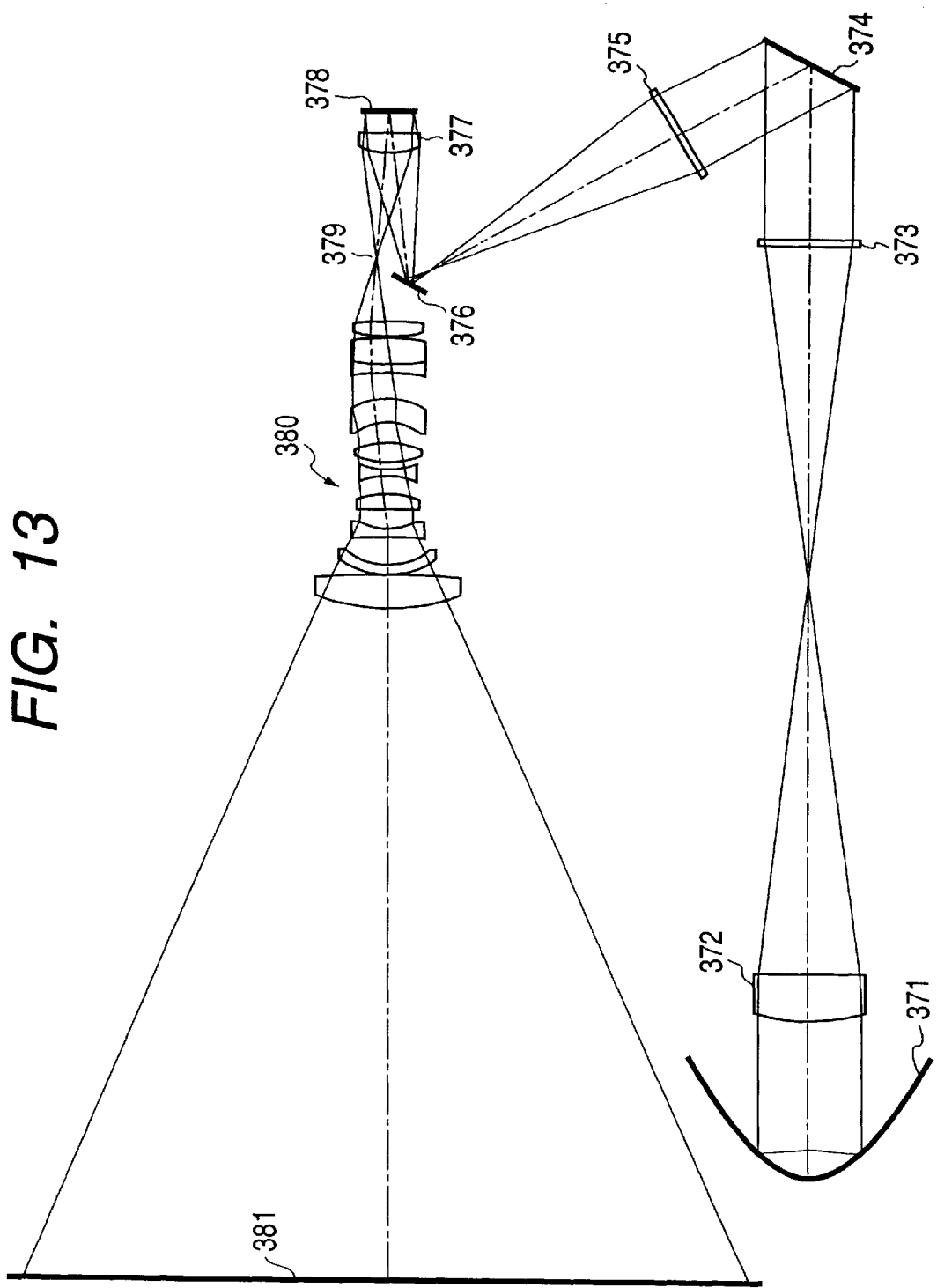
FIG. 13 is a liquid crystal projector realized by using a liquid crystal apparatus according to the invention.

Now, an optical system to which the embodiment of reflection type liquid crystal panels are incorporated will be described by referring to FIG. 13. Referring to FIG. 13, there are shown a light source 371 which may be a halogen lamp, a condenser 372 for converging rays of light coming from the light source, a pair of plane convex Fresnel lenses 373, 375, a color separating optical device 374 for separating light into R, G and B, which may advantageously be a dichroic mirror or a diffraction grating.

There are also shown a mirror unit 376 for leading separated R, G and B lights respectively to R, G and B panels, a finder lens 377 for collimating convergent rays of light before illuminating the reflection type liquid crystal panel, a reflection type liquid crystal device 378 having an LCD panel unit arranged at a predetermined position as described above by referring to the first through third embodiments and a diaphragm section 379. Additionally, there are also shown a projection lens 380 realized by combining a plurality of lens to operate as magnifier and a screen 381 that can display clear, bright and contrasty images when constituted by a Fresnel lens for collimating projected light and a lenticular lens for providing a wide viewing angle both vertically and horizontally. Note that, while FIG. 13 illustrates only a single panel for a single color, rays of light of three separated colors proceeds between the color separating optical device 374 and the diaphragm section 379 and actually three panels are required. However, it may be needless to say that the three panels can be replaced by a single panel by arranging a micro-lens array on the surface of the panel of the reflection type liquid crystal device to make different rays of incident light strike respectively different pixel regions. As a voltage is applied to the liquid crystal layer of the liquid crystal device, rays of light reflected by the pixels passes the diaphragm section 379 before they are projected onto the screen.

While no voltage is applied and the liquid crystal is a scattering body, rays of light entering the reflection type liquid crystal device are scattered isotropically so that only scattered rays of light directed to the aperture of the diaphragm section 379 can enter the projection lens. Only black will be displayed under this condition. As will be understood from the above description on the optical system, no polarization panel is required for the system. Additionally, since signal light is reflected by the entire surface of the pixel electrode before entering the projection lens, this arrangement can display an image brighter by two to three times than any comparable conventional arrangement. As described above, anti-reflection measures are taken on the surface and the interface of the opposite substrate so that noise factors are minimized for light and contrasty images can be displayed on the screen. Additionally, all the optical devices (lenses, mirrors, etc.) can be down-sized to reduce the cost and the weight because a small panel can be used.

Shadings and fluctuations of light and color of the light source can be prevented from being reflected on the screen by arranging an integrator (fly eye lens type, rod type) between the light source and the optical system.

Figure 14:
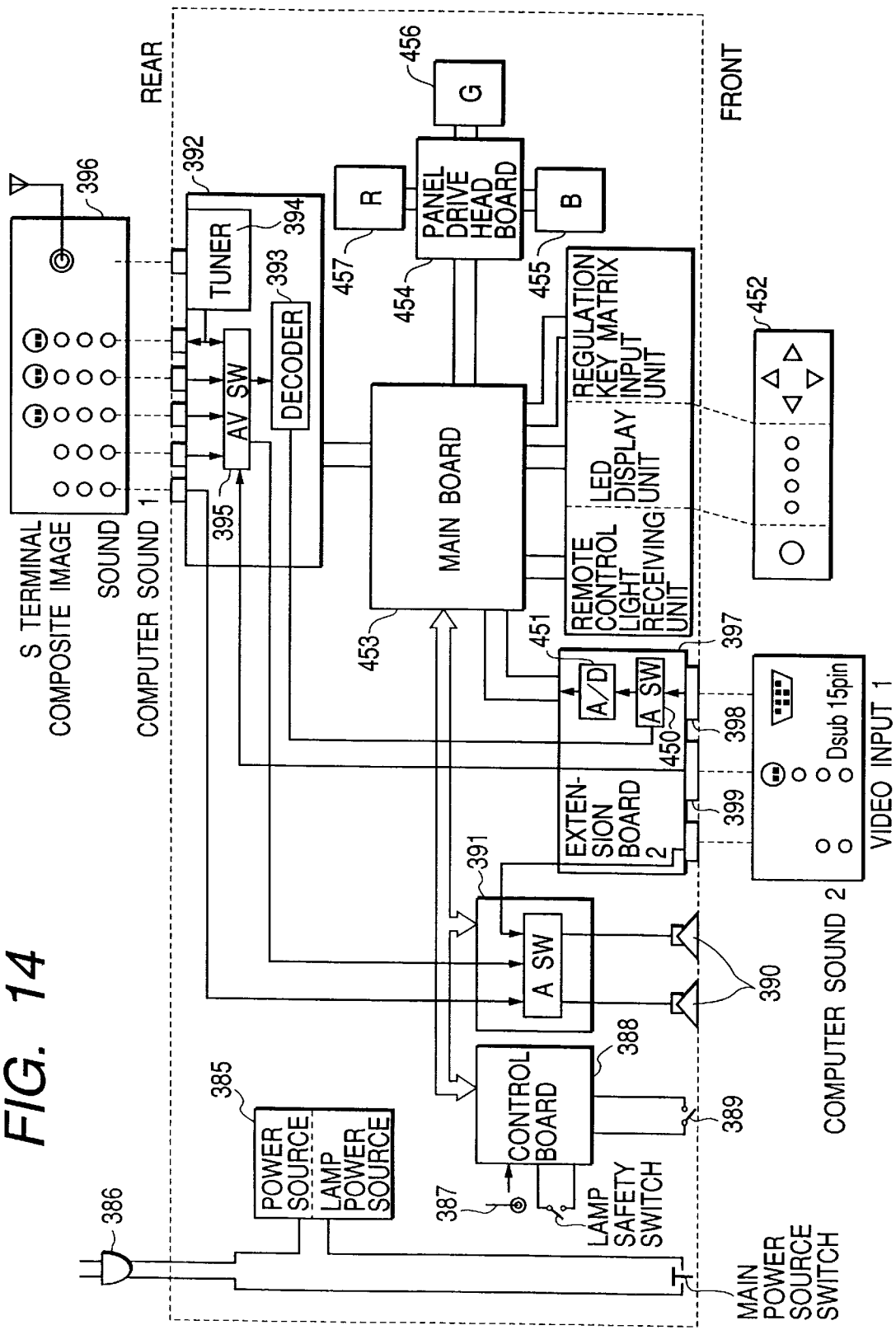
FIG. 14 is a schematic circuit block diagram of a liquid crystal projector, showing its internal arrangement.
Figure 16A:
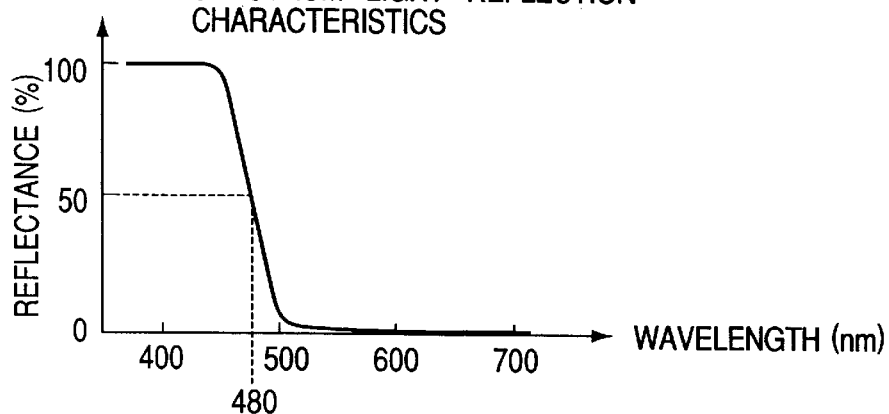
FIGS. 16A, 16B and 16C are graphs showing the spectral reflection characteristics of the reflective dichroic mirrors used for the optical system of a projection type liquid crystal display apparatus according to the invention.
Figure 16B:
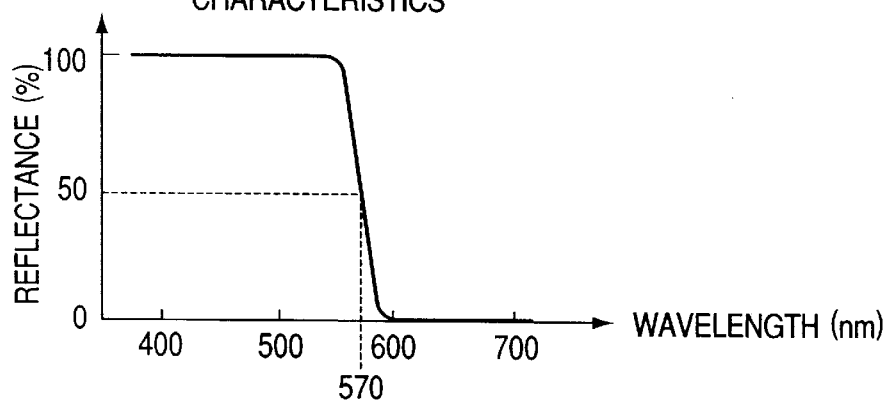
Figure 16C:
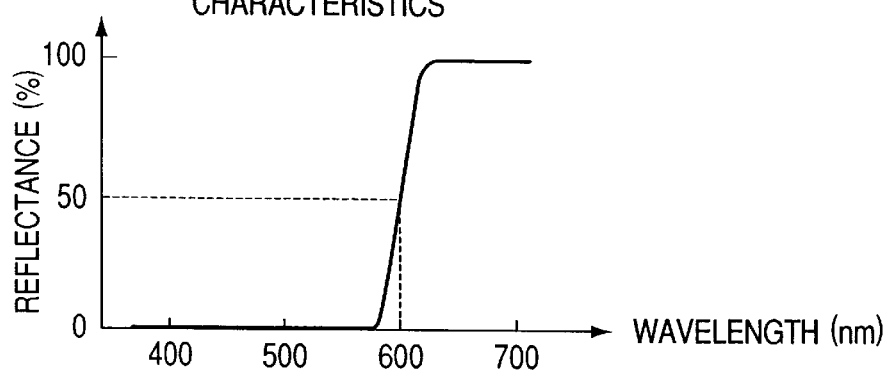

Now, the peripheral electric circuit other than the liquid crystal panel will be described by referring to FIG. 14. In FIG. 14, there are shown a bipartite power source 385 for supplying power to the lamps and also to the drive system for driving the panels and the signal processing circuit, a plug 386 and a lamp temperature sensor 387 adapted to cause the control board 388 to deenergize any lamps whose temperature is detected to be abnormal. The filter safety switch 389 is also controlled by the control board 388. For example, if the lamp house box show high temperature, the box cannot be opened by way of precaution. Reference numeral 390 denotes a loudspeaker and reference numeral 391 denotes a sound board that can contain a processor for 3D sounds and surround sounds if required. Reference numeral 392 denotes extension board 1 having input terminals for receiving signals from S terminals and other external sources 396 of signals for composite images and sounds, a selection switch 395 for selecting a signal and a tuner 394. Signals are sent from there to extension board 2 by way of a decoder 393. The extension board 2 has Dsub15 pin terminals to be connected to external video signal sources and computers and signals are converted into digital signals by an A/D converter 451 by way of a switch 450 for selecting the video signal from the decoder 393.

Reference numeral 453 denotes a main board comprising a CPU and memories including a video RAM as principal components. The NTSC signals subjected to A/D conversion by the A/D converter 451 are temporarily stored in a memory and additional signals are generated by interpolation for vacant liquid crystal elements to satisfactorily assign signals to the large number of pixels for high definition, while other signal processing operations proceed, including gamma conversion edge gradation, brightness adjustment and bias adjustment. If high resolution XGA panels are used and computer signals such as VGA signals are applied in stead of NTSC signals, a resolution conversion processing operation will also be conducted on the main board. The main board 453 also operate for synthetically combining NTSC signals of data not only for a single image but also for a plurality of images with computer signals. The output of the main board 453 is subjected to a serial/parallel conversion and applied to the heard board 454 in a form less adversely affected by noises. The head board 454 operates for carrying out a parallel/serial conversion and a D/A conversion for the output signal, which is divided according to the number of video lines of the panels and the signal is written onto the liquid crystal panels 455, 456 and 457 of B, G and R by means of respective drive amplifiers. Reference numeral 452 denotes a remote control panel with which computer images can be manipulated like TV images. The liquid crystal panels 455, 456 and 457 have an identical configuration that are same as the liquid crystal (LCD) panels described above for each of the first through third embodiments and provided with respective color filters of the corresponding colors. As described above, this embodiment of display apparatus can display neat and clear images.

[Fifth Embodiment]

FIGS. 15A to 15C are schematic illustrations of an embodiment of the optical system of a front and back projection type liquid crystal display apparatus according to the invention. In FIG. 15A shows a plan view, FIG. 15B shows a front view and FIG. 15C shows a side view. Referring to FIGS. 15A to 15C, there are shown a projection lens 1301 for projecting an image on the screen, a liquid crystal panel 1302 having a micro-lens, a polarization beam splitter (PBS) 1303, an R (red light) reflecting dichoric mirror 1340, a B/G (blue and green light) reflecting dichroic mirror 1341, a B (blue light) reflecting dichroic mirror 1342, a white light reflecting high reflection mirror 1343, a Fresnel lens 1350, a convex lens 1351, a rod type integrator 1306, an elliptic reflector 1307, an arc lamp 1308 of, for example, metal halide or UHP.

Figure 17:
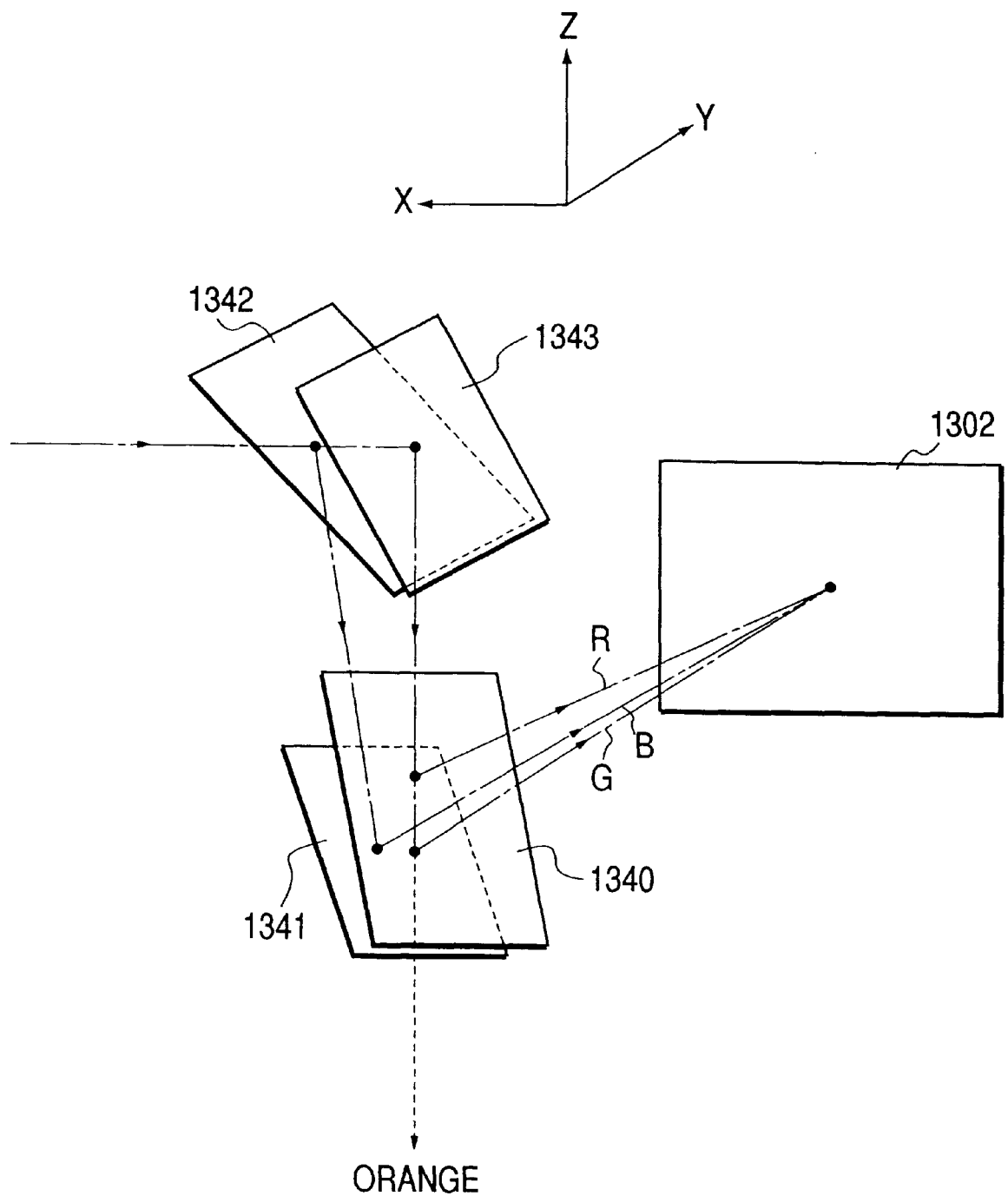
FIG. 17 is a schematic perspective view of the color separation illumination section of the optical system of a projection type liquid crystal display apparatus according to the invention.

Note that the R (red light) reflecting dichroic mirror 1340, the B/G (blue and green light) reflecting dichroic mirror 1341 and the B (blue light) reflecting dichroic mirror 1342 have respective spectrum reflection characteristics illustrated in FIG. 17. The dichroic mirrors and the high reflection mirror 1343 are three-dimensionally arranged as shown in the perspective view of FIG. 17 to divide illuminated white light and separate R, G and B light as will be described hereinafter and cause rays of light of the three primary colors to irradiate the liquid crystal panel 1302 with respective angles that are three-dimensionally different from each other.

The operation of the optical system will be described in terms of the proceeding route of a flux of light. Firstly, the flux of light emitted from the lamp 1308 of the light source of the system is that of white light and converged by the elliptic reflector 1307 toward the inlet port of the integrator 1306 arranged in front of it. As the flux of light proceeds through the integrator 1306 with repeated reflections, the spatial intensity distribution of the flux of light is uniformized. After coming out of the integrator 1306, the flux of light is collimated along the x-direction (as shown in the front view FIG. 15A) by the convex lens 1351 and the Fresnel lens 1350 before getting to the B reflecting dichroic mirror 1342. Only B light (blue light) is reflected by the B reflecting dichroic mirror 1342 and directed to the R reflecting dichroic mirror 1340 along the z-axis or downwardly in FIG. 15B, showing a predetermined angle relative to the z-axis.

Meanwhile, light than B light (R/G light) passes through the B reflecting dichroic mirror 1342 and reflected rectangularly by the high reflection mirror 1343 into the direction of the z-axis (downwardly) and also directed to the R reflecting dichroic mirror 1340. Referring to the front view of FIG. 15A, both the B reflecting dichroic mirror 1342 and the high reflection mirror 1343 are arranged to reflect the flux of light coming from the integrator 1306 (along the direction of the x-axis) into the direction of the z-axis (downwardly), the high reflection mirror 1343 being tilted around the axis of rotation, or the y-axis, exactly by 45° relative to the x-y plane. On the other hand, the B reflecting dichroic mirror 1342 is tilted around the axis of rotation, or the y-axis, by an angle less than 45° relative to the x-y plane. Thus, while R/G light reflected by the high reflection mirror 1343 is directed rectangularly toward the z-axis, B light reflected by the B reflecting dichroic mirror 1342 is directed downwardly, showing a predetermined angle relative to the z-axis (tilted in the x-z plane). Note that the extent of shifting the high reflection mirror 1343 and the B reflecting dichroic mirror 1342 relative to each other and the angle of tilt of the B reflecting dichroic mirror will be so selected that the principal beams of light of the three primary colors intersect each other on the liquid crystal panel 1302 in order to make B light and R/B light show an identical coverage on the liquid crystal panel 1302.

The downwardly directed fluxes of R/G/B light (along the z-axis) then proceeds to the R reflecting dichroic mirror 1340 and the B/G reflecting dichroic mirror 1341, which are located below the B reflecting dichroic mirror 1342 and the high reflection mirror 1343. The B/G reflecting dichroic mirror 1341 is tilted around the axis of rotation, or the x-axis by 45° relative to the x-z plane, whereas the R reflecting dichroic mirror 1340 is tilted around the axis of rotation, or the x-axis, by an angle less than 45° relative to the x-z plane. Thus, of the incoming fluxes of R/G/B light, those of B/G light firstly pass through the R reflecting dichroic mirror 1340 and reflected rectangularly by the B/G reflecting dichroic mirror 1341 into the positive direction of the y-axis before they are polarized and illuminate the liquid crystal panel 1302 arranged horizontally on the x-z plane. Of the fluxes of B/G light, that of B light shows a predetermined angle relative to the x-axis (tilted in the x-z plane) as described above (see FIGS. 15A and 15B) so that, after having been reflected by the B/G reflecting dichroic mirror 1341, it maintains the predetermined angle relative to the y-axis (tilted in the x-y plane) and illuminates the liquid crystal panel 1302 with an angle of incidence equal to the predetermined angle (relative to the x-y plane).

On the other hand, the flux of G light is reflected rectangularly by the B/G reflecting dichroic mirror 1341 and proceeds into the positive direction of the y-axis before it is polarized and hits the liquid crystal panel 1302 perpendicularly with an angle of incidence of 0°. The flux of R light is reflected by the R reflecting dichroic mirror 1340 which is arranged upstream relative to the B/G reflecting dichroic mirror 1341 as pointed out above into the positive direction of the y-axis and proceeds along the positive direction of the y-axis, showing a predetermined angle relative to the y-axis (titled in the y-z plane) as shown by (lateral view) of FIG. 15C before it is polarized by the PBS 1303 and hits the liquid crystal panel 1302 with an angle incidence equal to the predetermined angle (relative to the y-z plane).

As pointed out above, the extent of shifting the B/G reflecting dichroic mirror 1341 and the R reflecting dichroic mirror 1340 relative to each other and the angle of tilt of the R reflecting dichroic mirror will be so selected that the principal beams of light of the three primary colors intersect each other on the liquid crystal panel 1302 in order to make the fluxes of R/G/B light show an identical coverage on the liquid crystal panel 1302. The cutting frequency of the B reflecting dichroic mirror 1342 is 480 nm as shown by 16A and that of the B/G reflecting dichroic mirror 1341 is 570 nm as shown by 16B, whereas that of the R reflecting dichroic mirror 1340 is 600 nm. Thus, unnecessary orange light is discarded after passing through the B/G reflecting dichroic mirror 1341 to realize an optimal color balance.

Figures 29, 30:
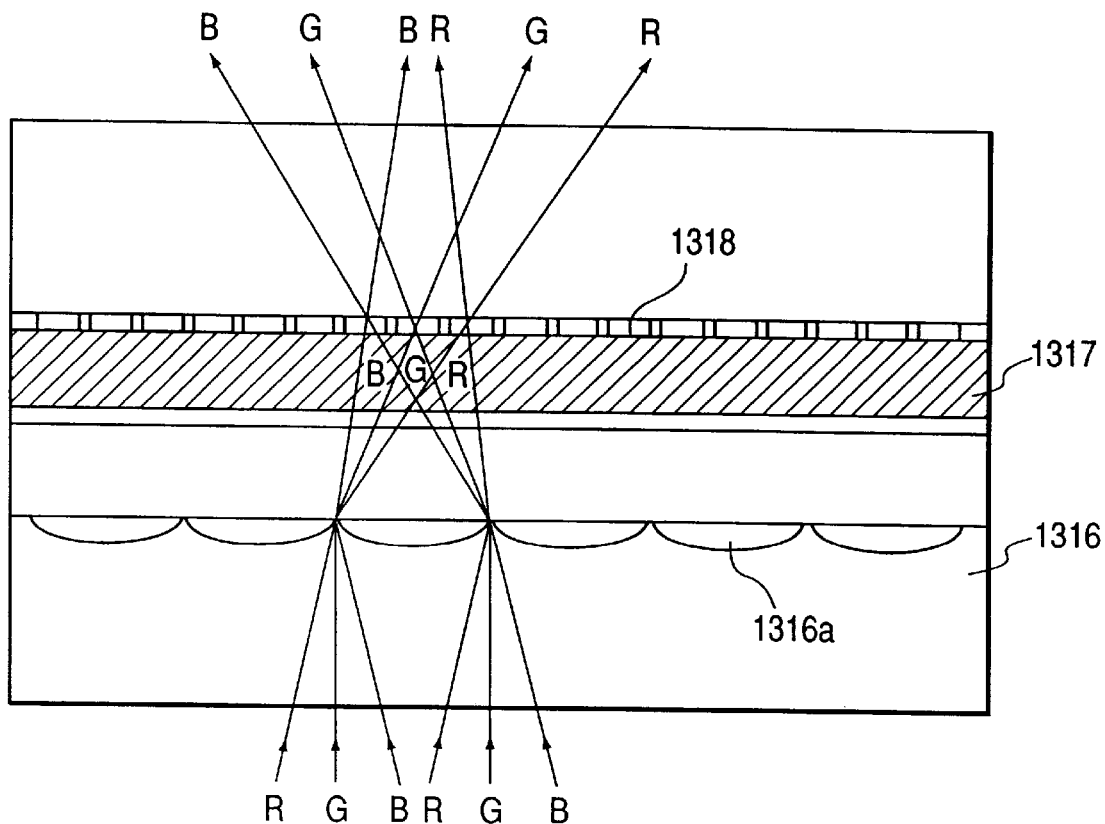
FIG. 29 is an enlarged partial cross sectional view of a known transmission type liquid crystal panel having micro-lenses.
FIG. 30 is a schematic illustration of the arrangement of color pixels of a known projection type liquid crystal display apparatus comprising a transmission type liquid crystal panel having micro-lenses.

As described in greater detail hereinafter, rays of R/G/B light are reflected and polarized for modulation by the liquid crystal panel 1302 and return to the PBS 1303, where the fluxes reflected into the positive direction of the x-axis by the PBS plane 1303a of the PBS 1303 are used as light for producing enlarged and projected images on the screen (not shown) by way of the projection lens 1301. Since the fluxes of R/G/B light striking the liquid crystal panel 1302 have respective angles of incidence that are different from each other, the fluxes of light reflected by it and coming out therefrom shows respective angles that are also different from each other. However, the projection lens 1301 has a lens diameter and an aperture that are large enough for accommodating the differences. Note that the fluxes of light striking the projection lens 1301 are collimated as they pass through the micro-lens array twice per each to maintain a predetermined angle for striking the liquid crystal panel 1302. With a known transmission type liquid crystal display apparatus as shown in FIG. 29, the flux of light exiting the liquid crystal panel is diametrically significantly enlarged partly due to the converging effect of the micro-lens array so that the projection lens for catching the flux is required to have a greater numerical aperture, making the projection lens costly. On the other hand, with this embodiment, the expansion of the flux of light coming from the liquid crystal panel 2 is relatively limited so that a sufficiently bright image can be projected on the screen by using a projection lens having a relatively small numerical aperture. While a stripe type display mode using vertically long stripes of same colors as shown in FIG. 30 may be used for this embodiment, such a mode of display is not preferable for a liquid crystal panel using a micro-lens array as will be described hereinafter.

Figure 18:
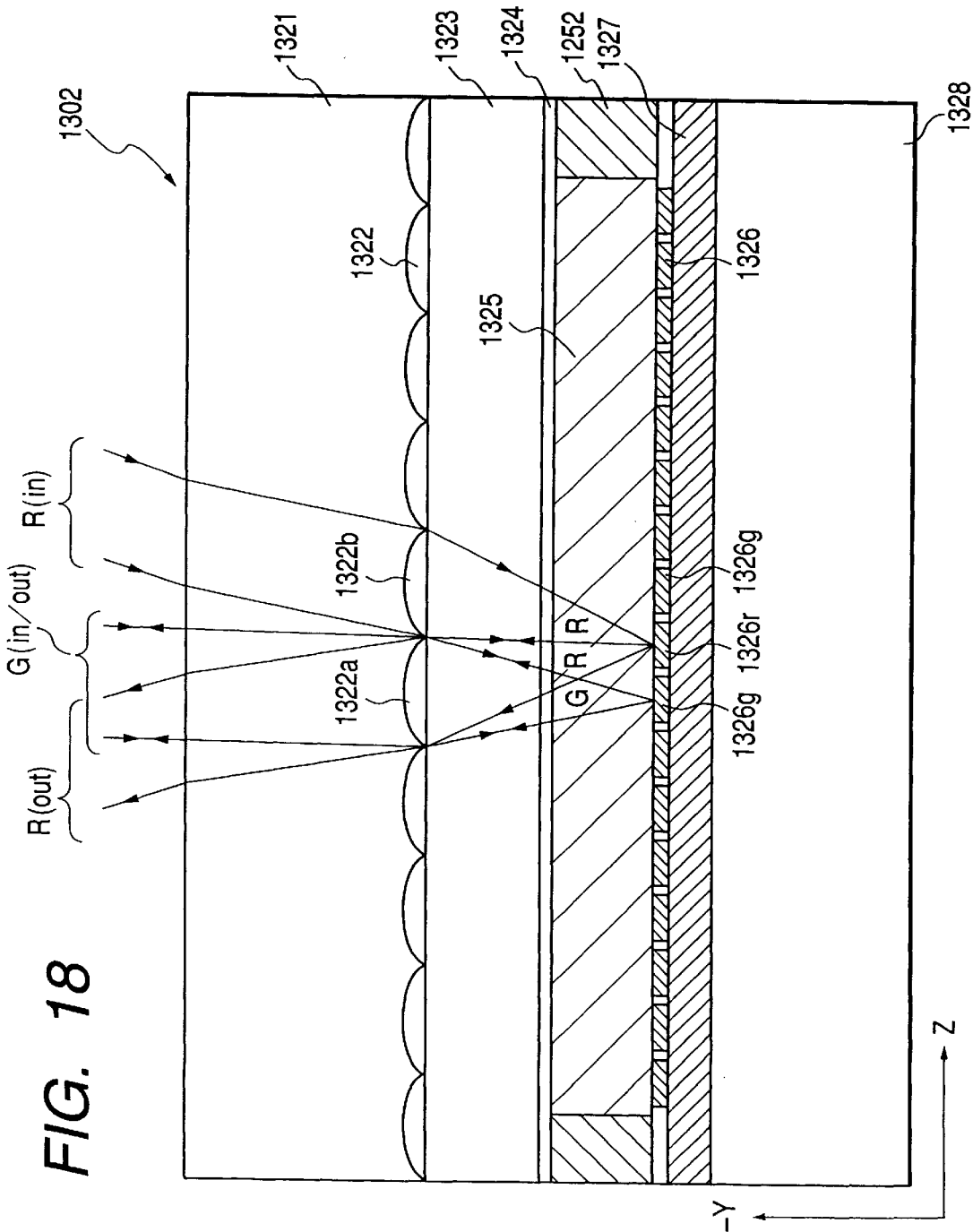
FIG. 18 is a schematic cross sectional view of an embodiment of liquid crystal panel according to the invention.

Now, the liquid crystal panel 1302 of this embodiment will be described. FIG. 18 is an enlarged schematic cross sectional view of the liquid crystal panel 1302 (taken along the y-z plane of FIG. 17). Referring to FIG. 18, there are shown a micro-lens substrate 1321, a number of micro-lenses 1322, a sheet glass 1323, a transparent opposite electrode 1324, a liquid crystal layer 1325, a number of pixel electrodes 1326, an active matrix drive circuit 1327 and a silicon semiconductor substrate 1328. Reference numeral 1352 denotes a peripheral seal section. In this embodiment, R, G and B pixels are intensively arranged on a single panel so that each single pixel inevitably has reduced dimensions. Thus, it is important that the panel shows a large aperture ratio and a reflection electrode should be found within the area covered by converged light so that the use of any of the arrangements of the first through fifth embodiments is significant for this embodiment. The micro-lenses 1322 are formed on the surface of a glass substrate (alkali glass) 1321 by means of a so-called ion-exchange technique and arranged in two-dimensional array at a pitch twice as high as that of the pixel electrodes 1326.

ECB (Electrically Controlled Birefringence) mode nematic liquid crystal such as DAP (Deformation of Aligned Phase) or HAN (Hybrid Aligned Nematic) that is adapted to a reflection type display is used for the liquid crystal layer 1325 and a predetermined orientation is maintained by means of an orientation layer (not shown). It will be appreciated that the circuit configuration and other arrangement of this invention is highly effective particularly for this embodiment because a voltage lower than its counterpart of the fourth embodiment is used in this embodiment and hence the accuracy of the potential of the pixel electrodes 1326 is highly important. Additionally, the LCD panel unit of any of the first through third embodiments may effectively be used for this embodiment because a large number of pixels are arranged on a single panel in this embodiment. The pixel electrodes 1326 are made of aluminum and operate as reflector. Therefore, they are processed by a so-called CMP treatment technique after the patterning operation in order to improve the smoothness and the reflectivity of the surface.

The active matrix drive circuit 1327 is a semiconductor circuit arranged on the silicon semiconductor substrate 1328 to drive the pixel electrodes 1326 in an active matrix drive mode. Thus, gate line drivers (vertical registers, etc.) and signal line drivers (horizontal registers, etc.) (not shown) are arranged in the peripheral area of the circuit matrix (as will be discussed in detail hereinafter). The peripheral drivers and the active matrix drive circuit are so arranged as to write primary color video signals of RGB on the respective RGB pixels in a predetermined fashion. Although the pixel electrodes 1326 are not provided with color filters, they are identified respectively as RGB pixels by the primary color image signals to be written onto them by said active matrix drive circuit as they are arranged in array.

Take, for example, rays of G light that illuminate the liquid crystal panel 1302. As described above, G light is polarized by the PBS 1303 and then perpendicularly strikes the liquid crystal panel 1302. FIG. 18 shows a beam of G light that enters the micro-lens 1322a in a manner as indicated by arrow G (in/out). As shown, the beam of G light is converged by the micro-lens 1322 to illuminate the surface of the G pixel electrode 1326g before it is reflected by the aluminum-made pixel electrode 1326G and goes out of the panel through the same micro-lens 1322a. As the beam of G light (polarized light) moves through the liquid crystal layer 1325, it is modulated by the electric field generated between the pixel electrode 1326g and the opposite electrode 1324 by the signal voltage applied to the pixel electrode 1326g before it returns to the PBS 1303. Thus, the quantity of light reflected by the PBS surface 1303a and directed to the projection lens 1301 changes depending on the extent of modulation to define the gradation of the related pixel.

On the other hand, R light enters the cross sectional plane (the y-z plane) of FIG. 18 slantly in a manner as described above after having been polarized by the PBS 1303. Take, now, a beam of R light striking the micro-lens 1322b. It is converged by the micro-lens 1322b in a manner as indicated by arrow R (in) in FIG. 18 to illuminate the surface of the R pixel electrode 1326r located at a position shifted to the left in FIG. 18 from the spot right below it before it is reflected by the pixel electrode 1326r and goes out of the panel through the adjacently located micro-lens 1322a (in the negative direction of the z-axis) (R(out)). As in the case of G light described above, as the beam of R light (polarized light) moves through the liquid crystal layer, it is modulated by the electric field generated between the pixel electrode 1326r and the opposite electrode 1324 by the signal voltage applied to the pixel electrode 1326r before it goes out of the liquid crystal panel and returns to the PBS 1303. Then, as described above in terms of G light, light from the pixel is projected through the projection lens 1301.

While the beams of G light and R light on the pixel electrodes 1326g and 1326r may appear overlapping and interfering with each other in FIG. 18, it is because the liquid crystal layer is shown excessively thick, although it has a thickness between 1 and 5 µm in reality, which is very small if compared with the sheet glass 1323 having a thickness between 50 and 100 µm so that no such interference actually takes place regardless of the size of each pixel.

Figure 19A:
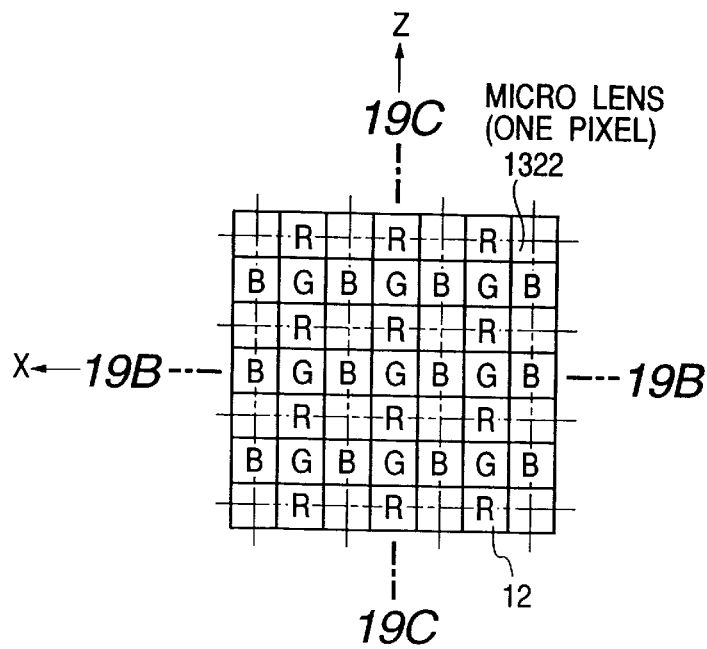
FIGS. 19A, 19B and 19C are schematic illustrations of the principle of color separation and color synthesis, underlying a liquid crystal panel according to the invention.
Figure 19C:
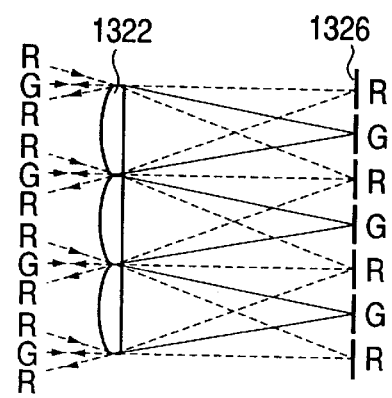
Figure 19B:
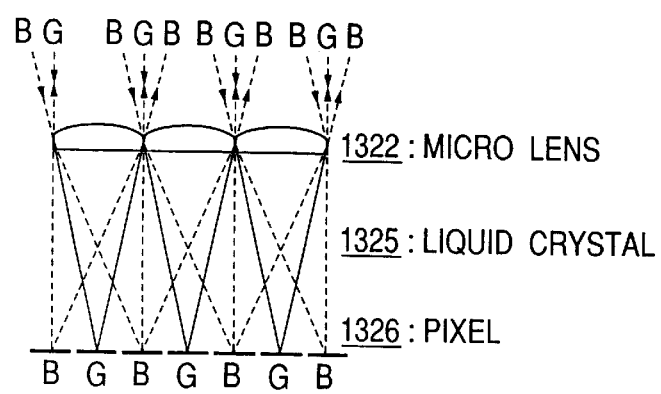

FIGS. 19A to 19C is schematic illustrations of the principle of color separation and color synthesis, underlying the liquid crystal panel 1302 of this embodiment. In FIG. 19A is a schematic plan view of the liquid crystal panel, whereas FIGS. 19B and 19C respectively show schematic cross sectional views taken along line 19B—19B (along the x-direction) and line 19C—19C (along the z-direction) of FIG. 19A. As indicated by dotted broken lines in FIG. 19A, each micro-lens 1322 corresponds to a half of a set of two-color pixels adjacently located with a G light pixel arranged at the center. Note that FIG. 19C corresponds to the cross sectional view of FIG. 18 taken along the y-z plane and shows how beams of G light and R light enter and go out from the respective micro-lenses 1322. As seen, each G pixel electrode is located right below a corresponding micro-lens and each R pixel electrode is located right below the boundary line of corresponding two adjacent micro-lenses. Therefore, the angle of incidence θ of R light is preferably so selected that tan θ is equal to the ratio of the pitch of pixel arrangement (B and R pixels) to the distance between the micro-lenses and the pixel electrode. On the other hand, FIG. 19B corresponds to a cross section of the liquid crystal panel 1302 taken along the x-y plane. As for the cross section along the x-y plane, it will be understood that B pixel electrodes and G pixel electrodes are arranged alternately as shown in FIG. 19C and each G pixel electrode is located right below a corresponding micro-lens whereas each B pixel electrode is located right below the boundary line of corresponding two adjacent micro-lenses. B light for irradiating the liquid crystal panel enters the latter slantly as viewed from the cross section (the x-y plane) of FIGS. 19A to 19C after having been polarized by the PBS 1303 as described above. Thus, just like R light, each beam of B light entering from a corresponding micro-lens 1322 is reflected by a corresponding B pixel electrode 1326b as shown and goes out of the panel through the adjacently located micro-lens 1322 in the x-direction. The mode of modulation by the liquid crystal on the B pixel electrodes 1326b and that of projection of B light coming out of the liquid crystal panel are same as those described above by referring to G light and R light. Each B pixel electrode 1326 is located right below the boundary line of corresponding two adjacent micro-lenses. Therefore, the angle of incidence θ of B light is preferably so selected that tan θ is equal to the ratio of the pitch of pixel arrangement (G and B pixels) to the distance between the micro-lenses and the pixel electrode. The pixels of the liquid crystal panel of this embodiment are arranged RGRGRG . . . in the z-direction and BGBGBG . . . in the x-direction. FIG. 19A shows the pixel arrangement as viewed from above. As seen, each pixel has a size equal to a half of a micro-lens for both longitudinally and transversally so that the pixels are arranged at a pitch twice as high as the micro-lenses. As viewed from above, each G pixel is located right below a corresponding micro-lens, while each R pixel is located right below the boundary line of corresponding two adjacent micro-lenses in the z-direction and each B pixel is located right below the boundary line of corresponding two adjacent micro-lenses in the x-direction. Each micro-lens has a rectangular contour (and is twice as large as a pixel).

Figure 20:
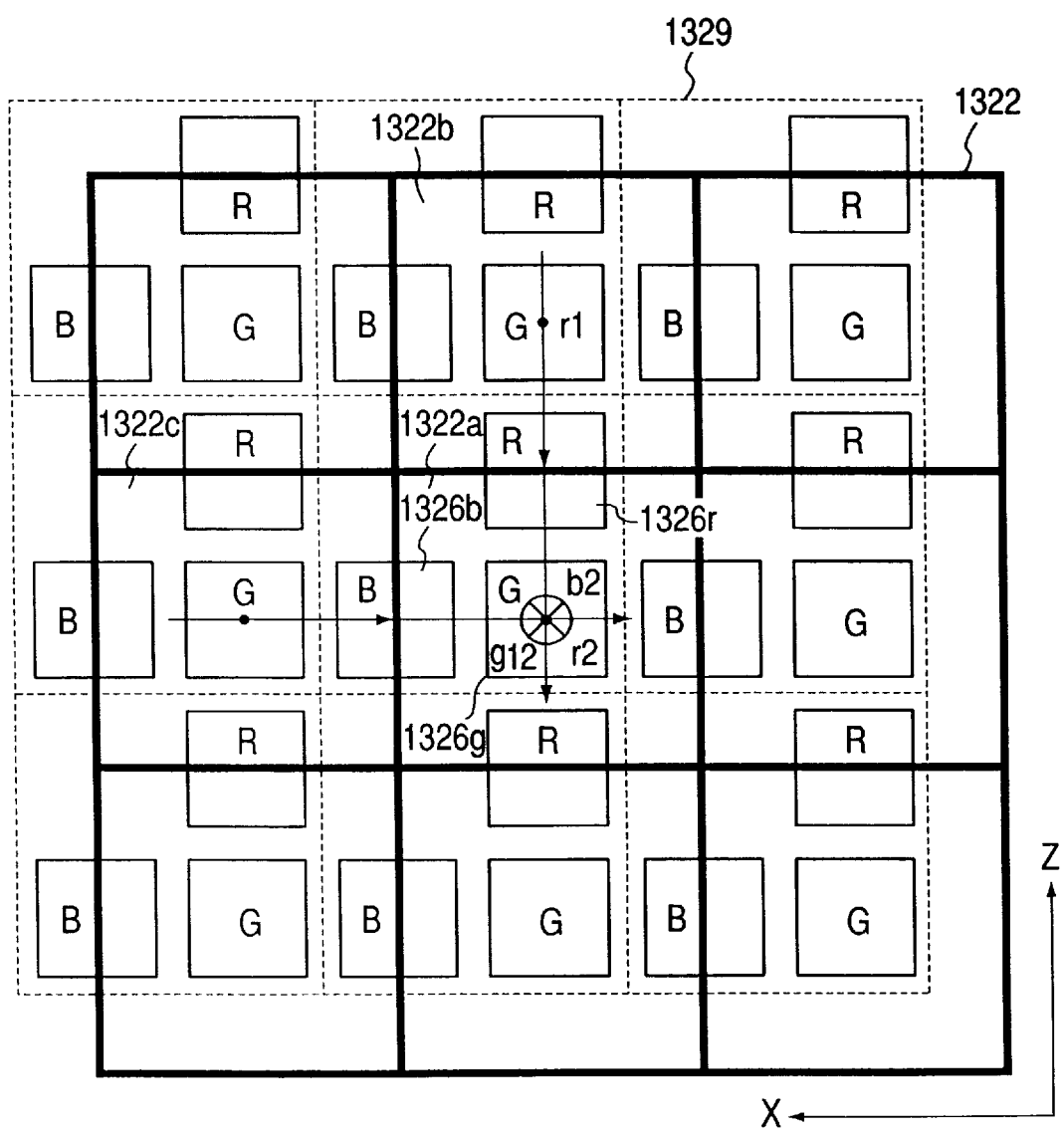
FIG. 20 is an enlarged partial plan view of the first embodiment of liquid crystal panel according to the invention.

FIG. 20 is an enlarged partial plan view of the liquid crystal panel of this embodiment. Each square 1329 defined by broken lines indicates a unit of RGB pixels. In other words, when the RGB pixels of the liquid crystal panel are driven by the active matrix drive circuit section 1327 of FIG. 18, the unit of RGB pixels in each broken line square 1329 is driven by corresponding RGB picture signals. Now, take the picture unit of R pixel electrode 1326r, G pixel electrode 1326g and B pixel electrode 1326b. The R pixel electrode 1326r is illuminated by R light coming from the micro-lens 1322b and striking the pixel electrode aslant as indicated by arrow r1 and reflected R light goes out through the micro-lens 1322a as indicated by arrow r2. The B pixel electrode 1326b is illuminated by B light coming from the micro-lens 1322c and striking the pixel electrode aslant as indicated by arrow b and reflected B light goes out through the micro-lens 1326a as indicated by arrow b2. Finally, the G pixel electrode 1326g is illuminated by G light coming from the micro-lens 1322a and striking the pixel electrode perpendicularly (downwardly in FIG. 20) as indicated by arrow g12 showing only the back and reflected G light goes out through the same micro-lens 1322a perpendicularly (upwardly in FIG. 20). Thus, while the beams of light of the three primary colors striking the picture unit of RGB pixels enters through different micro-lenses, they go out through a same micro-lens (1322a). The above description applies to all the picture unit (of RGB pixels) of the embodiment.

Figure 21:
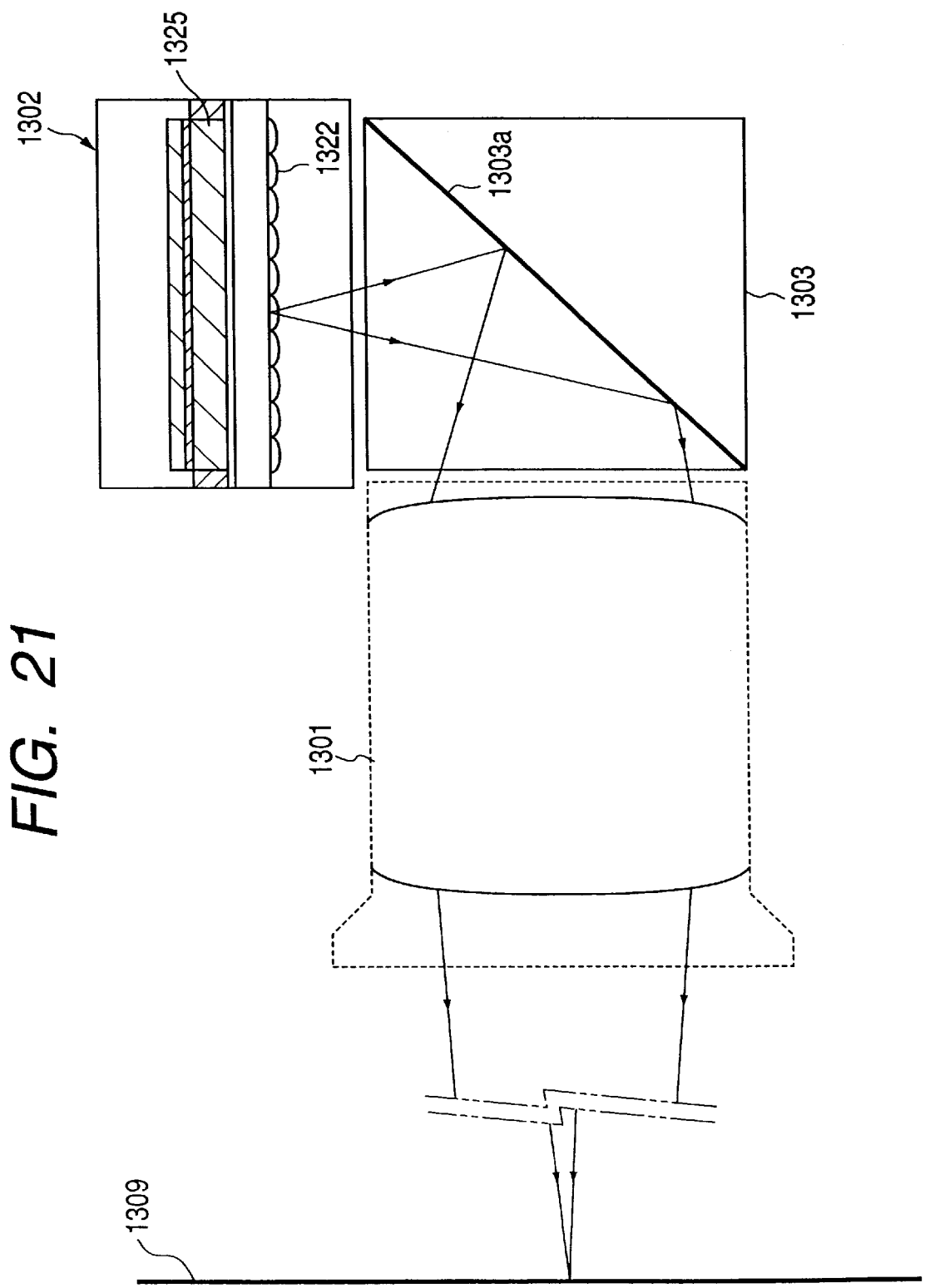
FIG. 21 is a schematic illustration of part of the projection optical system of a projection type liquid crystal display apparatus according to the invention.

Therefore, when light emitted from the liquid crystal panel of this embodiment is projected onto the screen 1309 by way of the PBS 1303 and the projection lens 1301 in such a way that a focused image of the micro-lenses 1322 of the liquid crystal panel 1302 is projected on the screen by regulating the optical system as shown in FIG. 21, the projected image will show the picture units of RGB pixels for the corresponding respective micro-lenses as perfect white light obtained by mixing the beams of light of the three primary colors. The net result will be the display of high quality color images free from the mosaic of RGB as shown in FIGS. 19A to 19C for a conventional liquid crystal panel.

As the active matrix drive circuit 1327 is located under the pixel electrodes 1326 as shown in FIG. 18, the drain of each pixel FET is connected to the corresponding one of the RGB pixel electrode arranged two-dimensionally as shown in FIG. 20.

Figure 22:
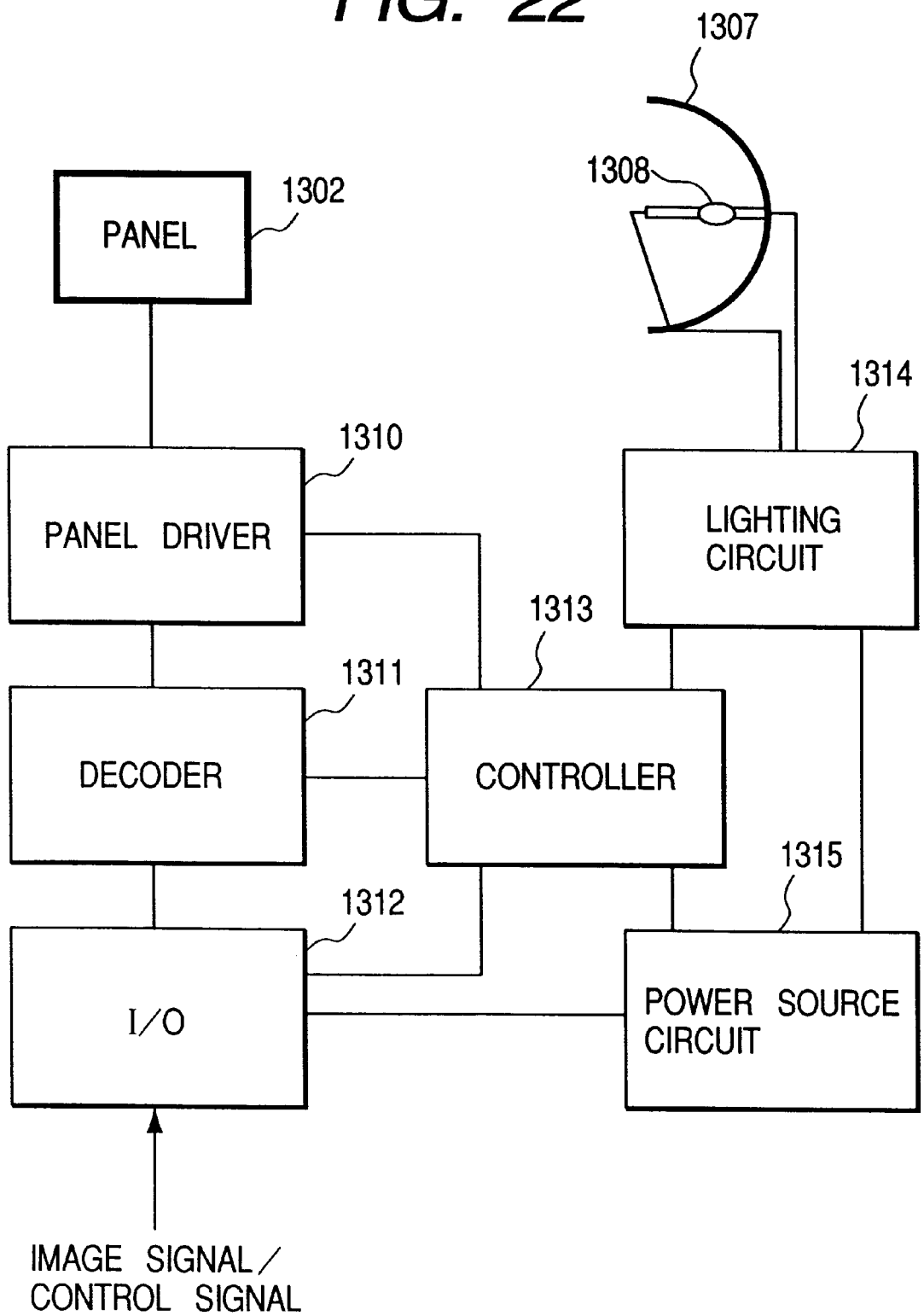
FIG. 22 is a schematic block diagram of the drive circuit of a projection type liquid crystal display apparatus according to the invention.
Figure 23A:
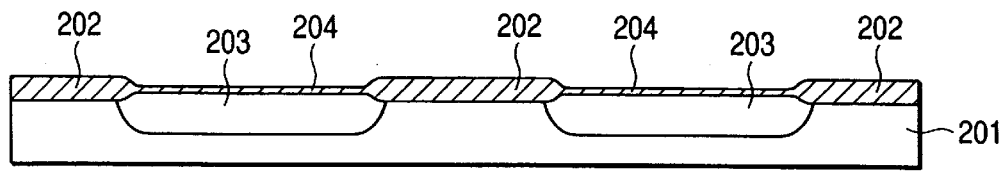
FIGS. 23A, 23B, 23C, 23D and 23E are enlarged schematic partial cross sectional views of the liquid crystal panel of a liquid crystal apparatus according to the invention, showing it in different manufacturing steps.
Figure 23B:
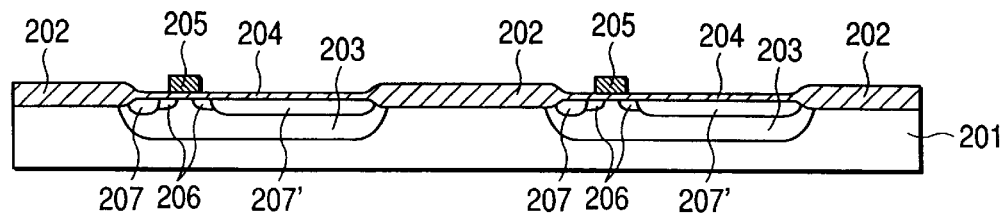
Figure 23C:
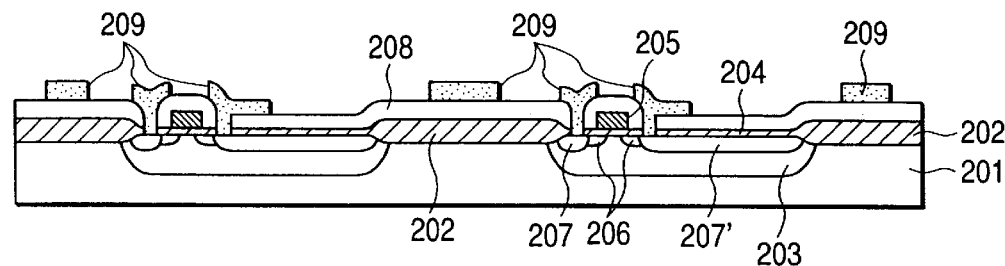
Figure 23D:
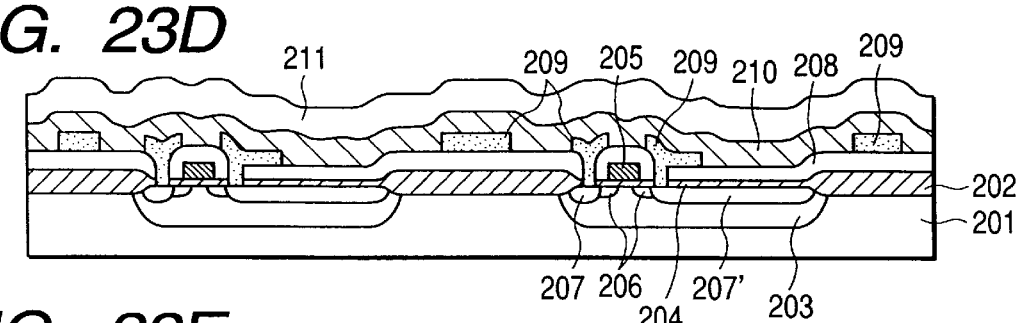
Figure 23E:
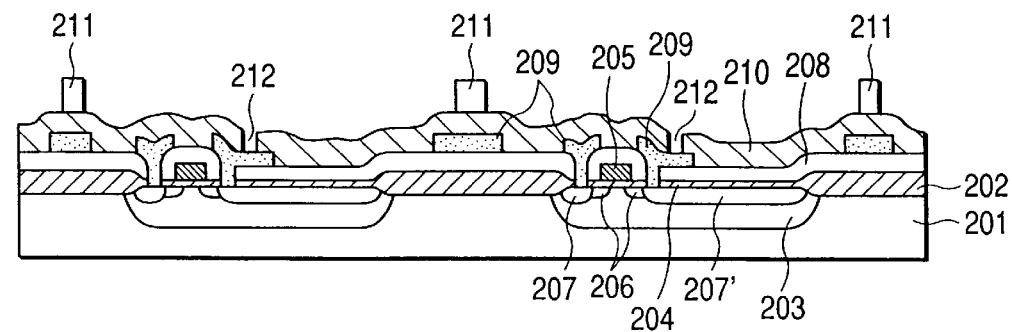
Figure 24F:
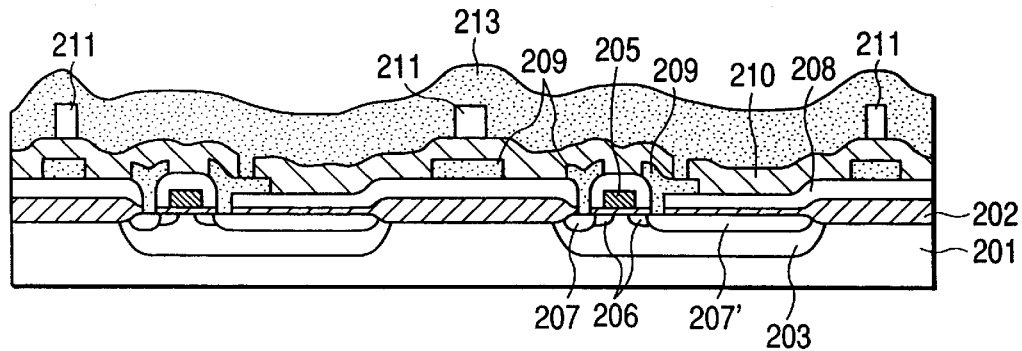
FIGS. 24F, 24G and 24H are enlarged schematic partial cross sectional views of the liquid crystal panel of a liquid crystal apparatus according to the invention, showing it indifferent manufacturing steps.
Figure 24G:
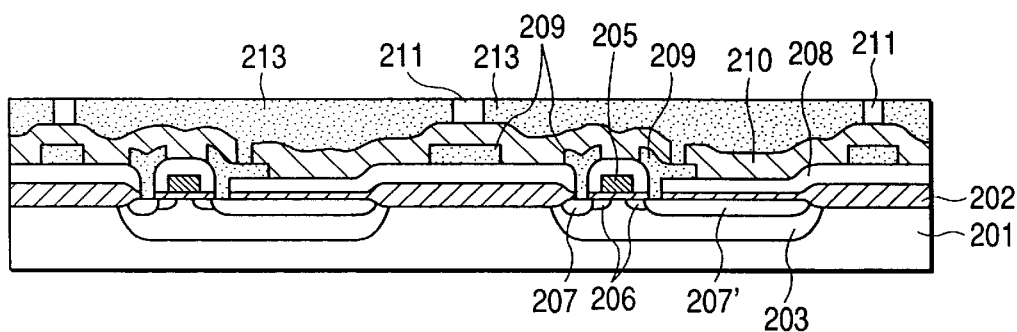
Figure 24H:
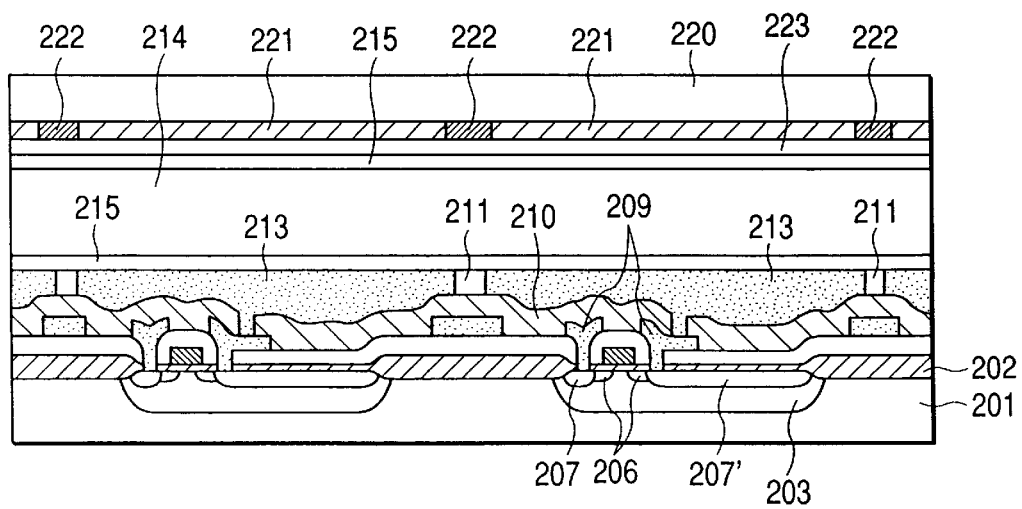
Figure 25:
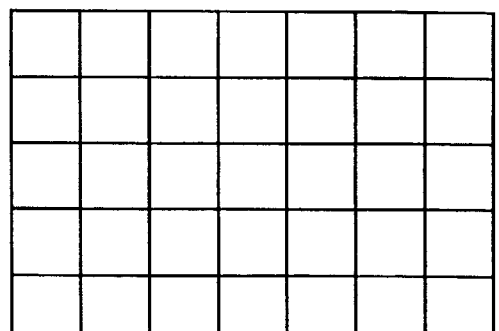
FIG. 25 is an enlarged partial plan view of an image projected on the display screen of a projection type liquid crystal display apparatus according to the invention.

FIG. 22 is a schematic block diagram of the drive circuit of the embodiment of projection type liquid crystal display apparatus. Reference numeral 1310 denotes a panel driver for inverting the polarity of each RGB picture signal and producing liquid crystal drive signals with a voltage amplified in a predetermined fashion and also drive signals and various timing signals for the opposite electrode 1324. Reference numeral 1312 denotes an interface for decoding various picture signals and control transmission signals into standard picture signals and standard control signals respectively. Reference numeral 1311 denotes a decoder for decoding/transforming the standard picture signals from the interface 1312 into picture signals for the RBG primary colors and synchronizing signals, or video signals adapted to the liquid crystal panel 1302. Reference numeral 1314 denotes a lighting circuit for driving and lighting the arc lamp 1308 in the elliptic reflector 1307. Reference numeral 1315 denotes a power supply circuit for feeding the circuit blocks with power. Reference numeral 1313 denotes a controller containing a control panel (not shown) for comprehensively controlling the circuit blocks. Thus, it will be seen that a projection type liquid crystal display apparatus according to the invention comprises a drive circuit that is rather popular and common to any known single panel type projectors. In other words, a liquid crystal display apparatus according to the invention can display high quality images free from the mosaic of RGB as shown in FIG. 22 without applying any heavy load on the drive circuit.

Figure 26:
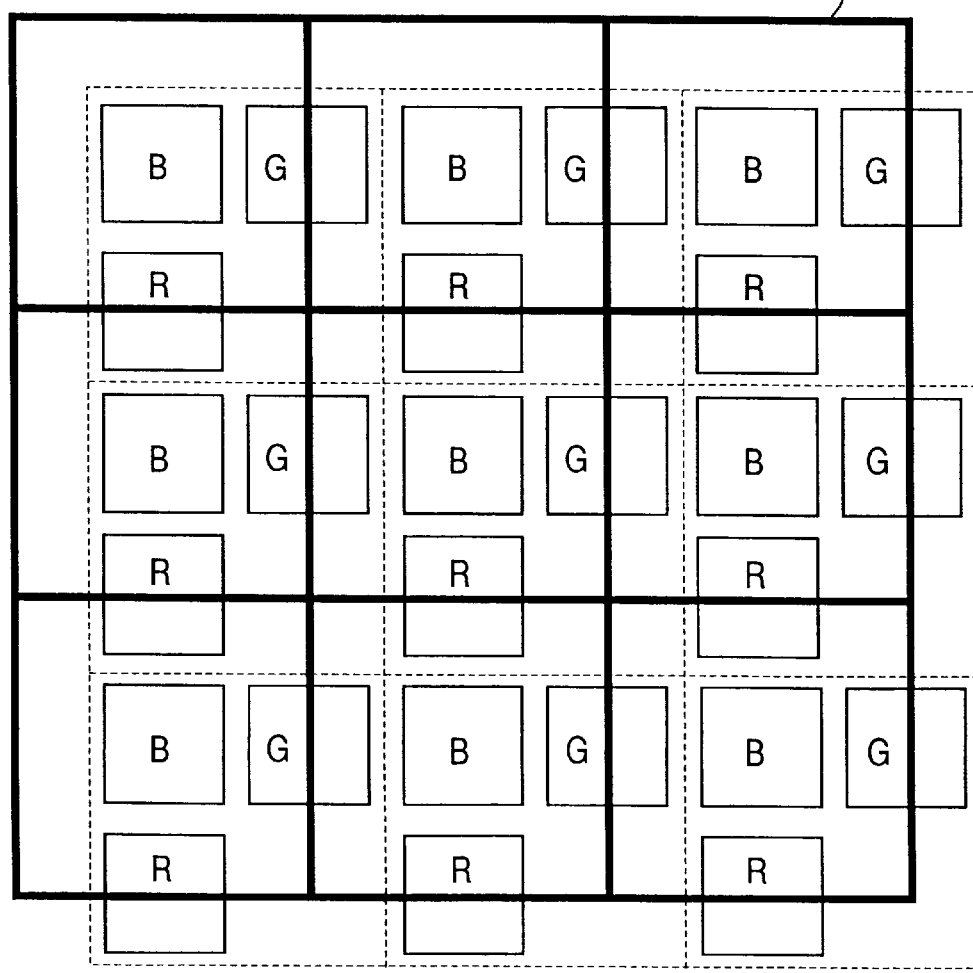
FIG. 26 is an enlarged partial plan view of another embodiment of liquid crystal panel according to the invention.

FIG. 26 is an enlarged partial plan view of another liquid crystal panel that can be used for this embodiment. In this panel, each B pixel electrode 1326*b* is arranged right below a corresponding micro-lens 1322 and sided transversally by a pair of G pixel electrodes 1326*g* and longitudinally by a pair of R pixel electrodes 1326*r*. With this arrangement, the panel operates exactly same as the above described panel as B light is made to strike it perpendicularly while R/G light is made to enter it slantly (with a same angle of incidence but in different directions) so that the beams of reflected light of the three primary colors come out of the respective RGB pixel electrodes of the corresponding picture unit through a common micro-lens. Alternatively, Each R pixel electrode may be arranged right below a corresponding micro-lens 1322 and sided by a pair of G pixel electrodes and a pair of B pixel electrodes.

[Sixth Embodiment]

Figure 27:
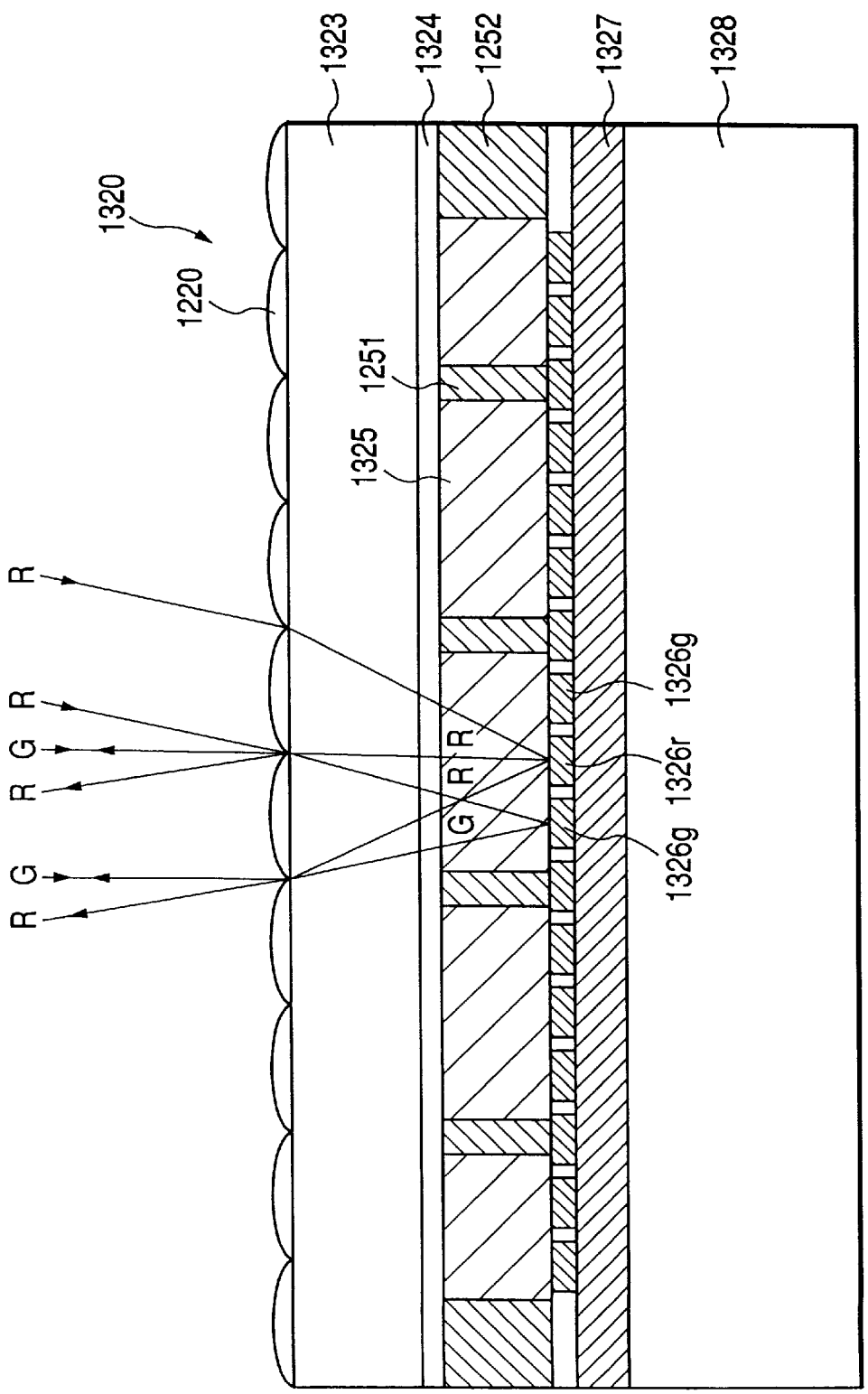
FIG. 27 is a schematic cross sectional view of the second embodiment of liquid crystal panel according to the invention.
Figure 28A:
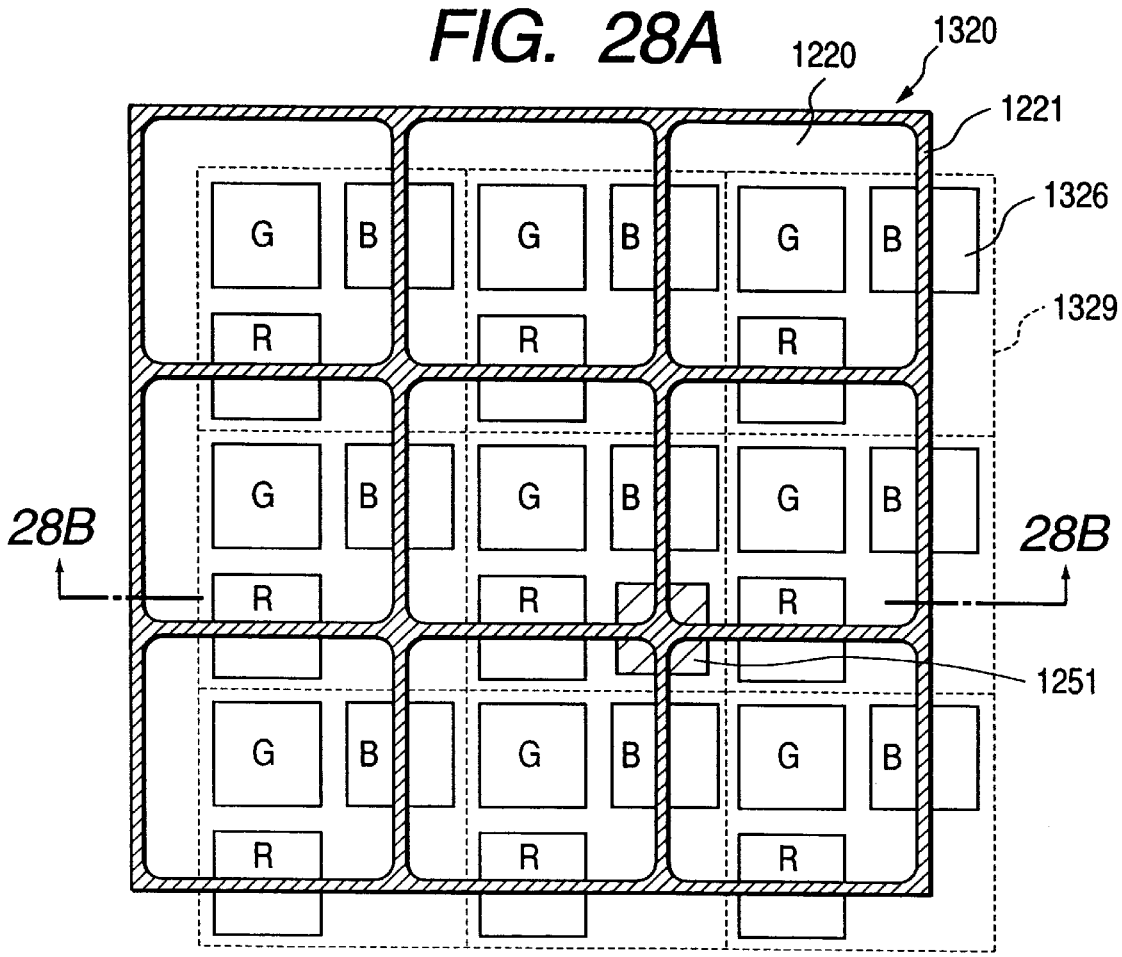
FIGS. 28A and 28B are respectively an enlarged partial plan view and a schematic cross sectional view of the second embodiment of liquid crystal panel according to the invention.

FIG. 27 is an enlarged schematic partial cross sectional view of a sixth embodiment of liquid crystal panel 1320 according to the invention. This embodiment differs from the fifth embodiment of FIG. 18 in that a piece of sheet glass 1323 is used as opposite glass substrate and the micro-lenses 1220 are formed on the sheet glass 1323 by means of thermoplastic resin and a reflowing technique. Additionally, column spacers 1251 are formed in non-pixel areas by means of photosensitive resin and photolithography. FIG. 28A shows a schematic partial plan view of the liquid crystal panel 1320. As shown, the liquid crystal panel comprises micro-lenses 1220, a light shielding layer 1221, a glass sheet 1323, a transparent opposite electrode 1324, a liquid crystal layer 1325, pixel electrodes 1326, an active matrix drive circuit 1327 and a silicon semiconductor substrate 1328 arranged under a micro-lens substrate (not shown). The micro-lenses 1322 are formed on the surface of the glass substrate (made of alkali type glass) 1321 by means of so-called ion-exchange and arranged at a pitch twice as high as that of the pixel electrodes 1326 to produce a two-dimensional array.

Figure 28B:
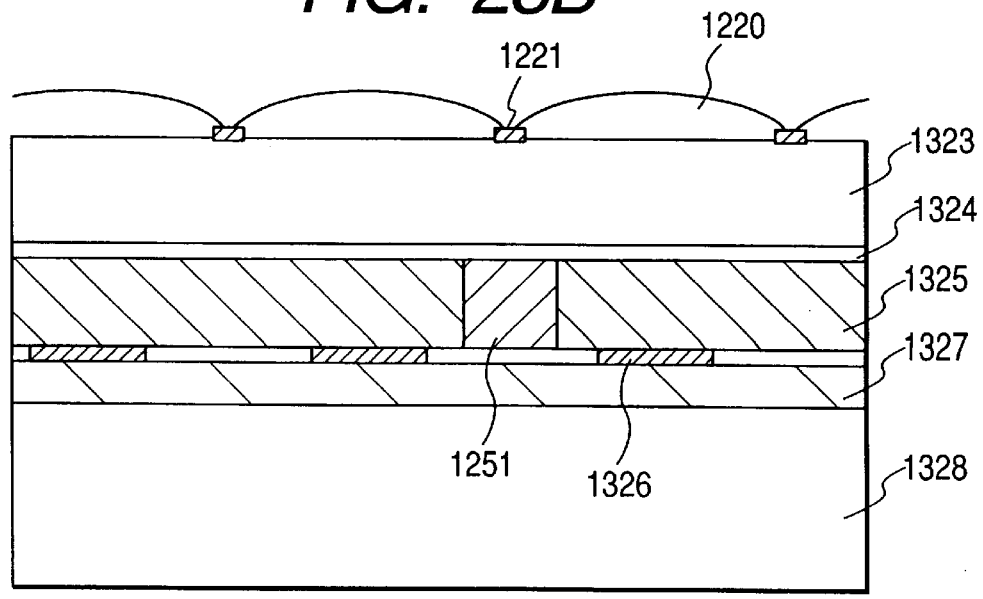

As seen from FIGS. 28A and 28B, column spacers 1251 are formed in non-pixel areas at selected corners of the micro-lenses 1220 at a predetermined pitch. In FIGS. 28A and 28B, FIG. 28B shows a schematic cross sectional view of the embodiment taken along line 28B—28B in FIG. 28A and across a column spacer 1251. Column spacers 1251 are preferably arranged at a pitch of every 10 to 100 pixels so as to show a matrix. Care has to be taken so that the number of column spacers can satisfy the two contradictory requirements of the planeness of the sheet glass 1323 and the pourability of liquid crystal. Still additionally, a light shielding layer 1221 of patterned metal film is arranged in this embodiment to prevent stray light from entering through boundary areas of the micro-lenses. This can effectively prevent any degradation of color saturation and contrast due to stray light. Thus, a projection type display apparatus comprising the embodiment of liquid crystal panel can display images of even higher quality particularly in terms of color saturation and contrast.

Thus, according to the present invention, there is provided a liquid crystal display apparatus comprising one or more than one shift registers, wherein the timing of turning off the input gate of the inverter connected to the gate of the pMOS transistor of the CMOS transistor is earlier than that of the input gate of the inverter connected to the gate of the nMOS transistor of the CMOS transistor by the difference between the two MOS transistors in the time required for getting to a threshold level after turning off the input gate. With such an arrangement, a liquid crystal display apparatus according to the invention can display high quality images without using a large area for the peripheral circuits by making both the pMOS transistor and the nMOS transistor show an identical turning-off performance for the CMOS transfer gate switch.

The effect of the invention is still enhanced by a liquid crystal display apparatus wherein the timing of turning off the input gate of the inverter connected to the input gate of the pMOS transistor is faster than that of turning off the input gate of the inverter connected to the input gate of the nMOS transistor of said CMOS transistor substantially by the difference in the time between the time of turning off the input gates and the time when the threshold level is reached.

For the purpose of the invention, said shift registers are horizontal shift register(s) and/or vertical shift register(s). More specifically, the voltage applied to the liquid crystal can be precisely controlled to realize a reflection type liquid crystal display apparatus adapted to produce high quality images without increasing the area occupied by the peripheral circuits by arranging circuits connected to the gates for the pMOS transistors with a number smaller than the number of circuits connected to the gates for the nMOS transistors.

Meanwhile, a projection type liquid crystal display apparatus according to the invention comprises a reflection type liquid crystal panel provided with micro-lenses and an optical system adapted to emit beams of light of the three primary colors in different respective directions but, once modulated and reflected by the liquid crystal, the beams from each picture unit of RGB pixels of moves through a same micro-lens. Then, the color images displayed by the apparatus are of high quality and free from a mosaic appearance of RGB.

Finally, the flux of light from each pixel is collimated as it passes through the micro-lens array twice so that a projection lens that has a small numerical aperture and hence is not expensive can be used to project bright images onto the screen.

What is claimed is:

1. A matrix substrate comprising:

a shift register for scanning provided with an inverter at an output stage of said shift register; and a sampling transistor for sampling an output from the inverter of said shift register for scanning, wherein said sampling transistor is provided with a CMOS transistor, the inverter of the output stage is connected to gates of pMOS and nMOS, each forming a part of the CMOS transistor of said sampling transistor, and, when the CMOS transistor of said sampling transistor is turned off, a timing of inputting, into the gate of the pMOS, the output from the inverter connected to the gate of pMOS of the CMOS transistor of the sampling transistor is earlier than a timing of inputting, into the gate of nMOS, the output from the inverter connected to the gate of said n-MOS of the CMOS transistor of the sampling transistor.

2. A display comprising:

a shift register for scanning provided with an inverter at an output stage of said shift register;

a sampling transistor for sampling an output from the inverter of said shift register for scanning, and a display panel, wherein said sampling transistor is provided with a CMOS transistor, the inverter of the output stage is connected to gates of pMOS and nMOS, each forming a part of the CMOS transistor of said sampling transistor, and, when the CMOS transistor of said sampling transistor is turned off, a timing of inputting, into the gate of the pMOS, the output from the inverter connected to the gate of pMOS of the CMOS transistor of the sampling transistor is earlier than a timing of inputting, into the gate of nMOS, the output from the inverter connected to the gate of said nMOS of the CMOS transistor of the sampling transistor.

3. A matrix substrate according to claim 1, wherein the timing of inputting into the gate of the pMOS of said CMOS transistor is earlier than that of inputting into the gate of the nMOS of said CMOS transistor substantially by the difference in the time between the time of inputting into the gates and the time when the threshold level of each of said pMOS and said nMOS is reached.

4. A display according to claim 2, wherein the timing of inputting into the gate of the pMOS of said CMOS transistor is earlier than that of inputting into the gate of the nMOS of said CMOS transistor substantially by the difference in the time between the time of turning off the gates and the time when the threshold level of the nMOS and the pMOS is reached.

5. A display comprising one or more shift registers according to claim 2 or 4 wherein said one or more shift registers are horizontal shift registers and the outputs are connected to respective CMOS transistors for sampling video signals.

6. A display comprising one or more shift registers according to claim 2 or 4, wherein said shift registers are vertical shift registers and the outputs are connected to the CMOS transistors.

7. A display according to claim 2 or 4, wherein a gate wire of the pMOS and a gate wire of the nMOS of said CMOS transistor overlaps with substantially equal area on a corresponding pixel electrode and substantially exhibit a mirror image relation relative to each other.

8. A display according to claim 6, wherein the number of circuits connected to gate wires of the pMOS is smaller than the number of circuits connected to gate wires of the nMOS.

9. A display according to claim 8, said display being of the reflection type and of the active drive type.

10. A display according to claim 9, said display having a plurality of R,G,B pixels, wherein a micro-lens is arranged for each of said R,G,B pixels.

11. A display according to claim 8, said display being of the transmission type using a transparent substrate.

12. A display according to claim 11, said display having a plurality of R,G,B pixels, wherein a micro-lens is arranged corresponding to every three of said R,G,B pixels.

13. A display according to claim 8, wherein said display is a liquid crystal display, said shift registers are scanning shift registers and each of liquid crystal panels scanned by said scanning shift registers comprises liquid crystal drive switch devices, pixel electrodes smoothed by CMP, an insulation layer, a liquid crystal layer and a transparent electrode.

14. A display according to claim 13, said display having a plurality of R,G,B pixels, wherein a transparent insulation layer is arranged on said transparent electrode and a micro-lens is arranged for every three of said R,G,B pixels.

15. A projector comprising a display according to claim 14 and a light source.

16. A projector according to claim 15, comprising an interface for converting video signals and control signals into a predetermined video system, decoders for converting video signals from said interface into image signals adapted to the liquid crystal panels of said liquid crystal display, panel drivers for driving said liquid crystal panels and ballasts for driving the lamp for illuminating said liquid crystal panels.

17. A display according to claim 2 or 4, wherein the number of circuits connected to gate wires of the pMOS is smaller than the number of circuits connected to gate wires of the nMOS.

18. A display according to claim 5, wherein the number of circuits connected to gate wires of the pMOS is smaller than the number of circuits connected to gate wires of nMOS transistors.

19. A display according to claim 2 or 4, said display being of the reflection type and of the active drive type.

20. A display according to claim 5, said display being of the reflection type and of the active drive type.

21. A display according to claim 7, said display being of the reflection type and of the active drive type.

22. A display according to claim 17, said display being of the reflection type and of the active drive type.

23. A display according to claim 18, said display being of the reflection type and of the active drive type.

24. A display according to claim 2 or 4, said display being of the transmission type using a transparent substrate.

25. A display according to claim 5, said display being of the transmission type using a transparent substrate.

26. A display according to claim 6, said display being of the transmission type using a transparent substrate.

27. A display according to claim 7, said display being of the transmission type using a transparent substrate.

28. A display according to claim 17, said display being of the transmission type using a transparent substrate.

29. A display according to claim 18, said display being of the transmission type using a transparent substrate.

30. A display according to claim 2 or 4, wherein said display is a liquid crystal display, said shift register is a scanning shift register and each of liquid crystal panels scanned by said scanning shift register comprises liquid crystal drive switch devices, pixel electrodes smoothed by CMP, an insulation layer, a liquid crystal layer and a transparent electrode.

31. A display according to claim 5, wherein said display is a liquid crystal display, said shift registers are scanning shift registers, and each of liquid crystal panels scanned by said scanning shift registers comprises liquid crystal drive switch devices, pixel electrodes smoothed by CMP, an insulation layer, a liquid crystal layer and a transparent electrode.

32. A display according to claim 6, wherein said display is a liquid crystal display, said shift registers are scanning shift registers and each of liquid crystal panels scanned by said scanning shift registers comprises liquid crystal drive switch devices, pixel electrodes smoothed by CMP, an insulation layer, a liquid crystal layer and a transparent electrode.

33. A display according to claim 7, wherein said display is a liquid crystal display, said shift register is a scanning shift register and each of liquid crystal panels scanned by said scanning shift register comprises liquid crystal drive switch devices, pixel electrodes smoothed by CMP, an insulation layer, a liquid crystal layer and a transparent electrode.

34. A display according to claim 17, wherein said display is a liquid crystal display, said shift register is a scanning shift register and each of liquid crystal panels scanned by said scanning shift register comprises liquid crystal drive switch devices, pixel electrodes smoothed by CMP, an insulation layer, a liquid crystal layer and a transparent electrode.

35. A display according to claim 18, wherein said display is a liquid crystal display, said shift registers are scanning shift registers and each of liquid crystal panels scanned by said scanning shift registers comprises liquid crystal drive switch devices, pixel electrodes smoothed by CMP, an insulation layer, a liquid crystal layer and a transparent electrode.

* * * * *

UNITED STATES PATENT AND TRADEMARK OFFICE
CERTIFICATE OF CORRECTION

PATENT NO.   : 6,559,821 B2
DATED        : May 6, 2003
INVENTOR(S)  : Takeshi Ichihawa It is certified that error appears in the above-identified patent and that said Letters Patent is hereby corrected as shown below:

Column 1,
Line 55, "(extended" should read -- (Extended --; and
Line 56, "extended Graphics" should read -- Extended Graphic --.

Column 7,
Line 33, "change to change" should be deleted.

Column 8,
Line 9, "of-the" should read -- of the --.

Column 10,
Line 32, "width" should read -- widths --; and
Line 38, "all the more" should be deleted.

Column 11,
Line 39, "lap top" should read -- laptop --.

Column 13,
Line 38, "AiC" should read -- AlC --.

Column 15,
Line 52, "edges" should read -- edge --.

Column 22,
Line 49, "unit" should read -- units --.

Column 23,
Line 40, "Each" should read -- each --.

UNITED STATES PATENT AND TRADEMARK OFFICE
CERTIFICATE OF CORRECTION

PATENT NO.    : 6,559,821 B2
DATED         : May 6, 2003
INVENTOR(S)   : Takeshi Ichihawa It is certified that error appears in the above-identified patent and that said Letters Patent is hereby corrected as shown below:

<u>Column 25,</u>
Line 18, "n-MOS" should read -- nMOS --; and
Line 55, "4 wherein" should read -- 4, wherein --.

Signed and Sealed this

Twentieth Day of January, 2004

JON W. DUDAS
*Acting Director of the United States Patent and Trademark Office*